(12) United States Patent
Huang

(10) Patent No.: US 11,894,264 B2
(45) Date of Patent: Feb. 6, 2024

(54) METHOD FOR FABRICATING SEMICONDUCTOR DEVICE WITH COVERING LINERS

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 118 days.

(21) Appl. No.: 17/716,117

(22) Filed: Apr. 8, 2022

(65) Prior Publication Data

US 2022/0230913 A1   Jul. 21, 2022

Related U.S. Application Data

(62) Division of application No. 16/902,692, filed on Jun. 16, 2020, now Pat. No. 11,610,811.

(51) Int. Cl.
| | | |
|---|---|---|
| H01L 21/768 | (2006.01) | |
| H01L 23/532 | (2006.01) | |
| H01L 23/528 | (2006.01) | |
| H10B 12/00 | (2023.01) | |

(52) U.S. Cl.
CPC .... *H01L 21/76831* (2013.01); *H01L 21/7682* (2013.01); *H01L 21/76802* (2013.01); *H01L 21/76825* (2013.01); *H01L 21/76828* (2013.01); *H01L 21/76844* (2013.01); *H01L 21/76846* (2013.01); *H01L 23/5283* (2013.01); *H01L 23/5329* (2013.01); *H10B 12/315* (2023.02); *H10B 12/482* (2023.02)

(58) Field of Classification Search
CPC ....... H01L 2221/1047; H01L 21/76825; H01L 21/76828; H01L 21/76831
See application file for complete search history.

(56) References Cited

U.S. PATENT DOCUMENTS

| | | |
|---|---|---|
| 7,348,617 B2 | 3/2008 | Kumura et al. |
| 7,564,136 B2 | 7/2009 | Yeh et al. |
| 8,211,794 B2 | 7/2012 | Arunachalam et al. |
| 8,372,739 B2 | 2/2013 | Ishizaka et al. |

(Continued)

OTHER PUBLICATIONS

Office Action dated May 24, 2022 related to U.S. Appl. No. 16/902,692, wherein this application is a DIV of U.S. Appl. No. 16/902,692.

*Primary Examiner* — Daniel Luke
(74) *Attorney, Agent, or Firm* — Xuan Zhang

(57) ABSTRACT

The present application discloses provides a method for fabricating a semiconductor device. The method includes providing a substrate, forming a sacrificial structure above the substrate, forming a supporting liner covering the sacrificial structure, forming an energy-removable layer covering the supporting liner, performing a planarization process until a top surface of the sacrificial structure is exposed, performing an etch process to remove the sacrificial structure and concurrently form a first opening in the energy-removable layer, forming covering liners on sidewalls of the first opening and on a top surface of the energy-removable layer, forming a first conductive feature in the first opening, and applying an energy source to turn the energy-removable layer into a porous insulating layer.

13 Claims, 35 Drawing Sheets

(56) References Cited

U.S. PATENT DOCUMENTS

| | | | |
|---|---|---|---|
| 8,900,989 B2* | 12/2014 | Tsai | H01L 21/76843 |
| | | | 438/622 |
| 9,343,357 B2 | 5/2016 | Xu et al. | |
| 11,164,778 B2 | 11/2021 | Wang et al. | |
| 2019/0164748 A1* | 5/2019 | Chou | H01L 21/76802 |
| 2019/0237356 A1* | 8/2019 | Srivastava | H01L 23/5226 |

* cited by examiner

# METHOD FOR FABRICATING SEMICONDUCTOR DEVICE WITH COVERING LINERS

CROSS-REFERENCE TO RELATED APPLICATION

This application is a divisional application of U.S. Non-Provisional application Ser. No. 16/902,692 filed Jun. 16, 2020, which is incorporated herein by reference in its entirety.

TECHNICAL FIELD

The present disclosure relates to a method for fabricating a semiconductor device, and more particularly, to a method for fabricating a semiconductor device with covering liners.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a substrate, a porous insulating layer positioned above the substrate, a first conductive feature positioned in the porous insulating layer, and covering liners including two top segments and two side segments. The two side segments are positioned on sidewalls of the first conductive feature, and the two top segments are positioned on top surfaces of the porous insulating layer.

In some embodiments, the semiconductor device includes supporting liners positioned between the two side segments of the covering liners and the porous insulating layer and between the porous insulating layer and the substrate.

In some embodiments, a thickness of supporting liners is between about 2 nm and about 20 nm.

In some embodiments, a thickness of the two side segments of the covering liners is gradually decreased toward the substrate.

In some embodiments, a thickness of the two top segments of the covering liners is between about 1 angstrom and about 30 angstroms.

In some embodiments, a porosity of the porous insulating layer is between about 10% and about 50%.

In some embodiments, the covering liners are formed of metal oxide.

In some embodiments, an aspect ratio of the first conductive feature is between about 1:3 and about 1:15.

In some embodiments, the semiconductor device includes a first barrier layer positioned between the two side segments of the covering liners and the first conductive feature and between the porous insulating layer and the substrate.

In some embodiments, a thickness of the first barrier layer is between about 10 angstroms and about 15 angstroms.

In some embodiments, bottommost points of the two side segments of the covering liners are at a vertical level lower than a bottom surface of the porous insulating layer.

Another aspect of the present disclosure provides a method for fabricating a semiconductor device including providing a substrate, forming a sacrificial structure above the substrate, forming a supporting liner covering the sacrificial structure, forming an energy-removable layer covering the supporting liner, performing a planarization process until a top surface of the sacrificial structure is exposed, performing an etch process to remove the sacrificial structure and concurrently form a first opening in the energy-removable layer, forming covering liners on sidewalls of the first opening and on a top surface of the energy-removable layer, forming a first conductive feature in the first opening, and applying an energy source to turn the energy-removable layer into a porous insulating layer.

In some embodiments, the supporting liner is formed of silicon nitride.

In some embodiments, the energy-removable layer includes a base material and a decomposable porogen material.

In some embodiments, the base material includes methylsilsesquioxane, low-dielectric materials, or silicon oxide.

In some embodiments, the energy source is heat, light, or a combination thereof.

In some embodiments, the covering liners are formed of metal oxide.

In some embodiments, the step of forming the sacrificial structure above the substrate includes forming a bottom sacrificial layer above the substrate, forming a top sacrificial layer on the bottom sacrificial layer, performing a photolithography-etch process to remove portions of the bottom sacrificial layer and portions of the top sacrificial layer and concurrently form the sacrificial structure.

In some embodiments, the bottom sacrificial layer is formed of silicon carbon.

In some embodiments, the method for fabricating the semiconductor device includes a step of forming a first barrier layer in the first opening before the step of forming the first conductive feature in the first opening.

Due to the design of the semiconductor device of the present disclosure, the porous insulating layer may reduce the parasitic capacitance between conductive features of the semiconductor device. In addition, with the assistant of the covering liner, the first conductive feature may be formed without any void. Therefore, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
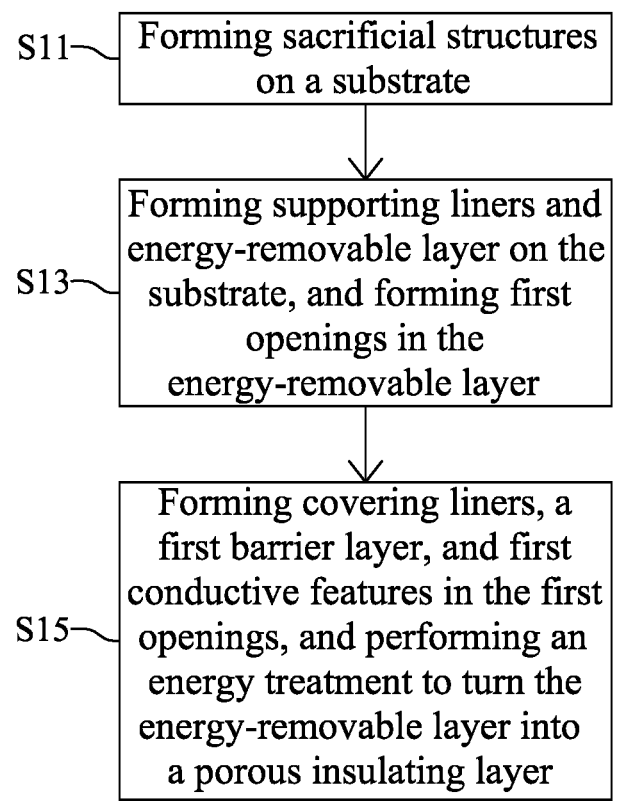
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method for fabricating a semiconductor device 1A in accordance with one embodiment of the present disclosure. FIGS. 2 to 8 illustrate, in schematic cross-sectional view diagrams, a flow for fabricating the semiconductor device 1A in accordance with one embodiment of the present disclosure.

Figure 2:
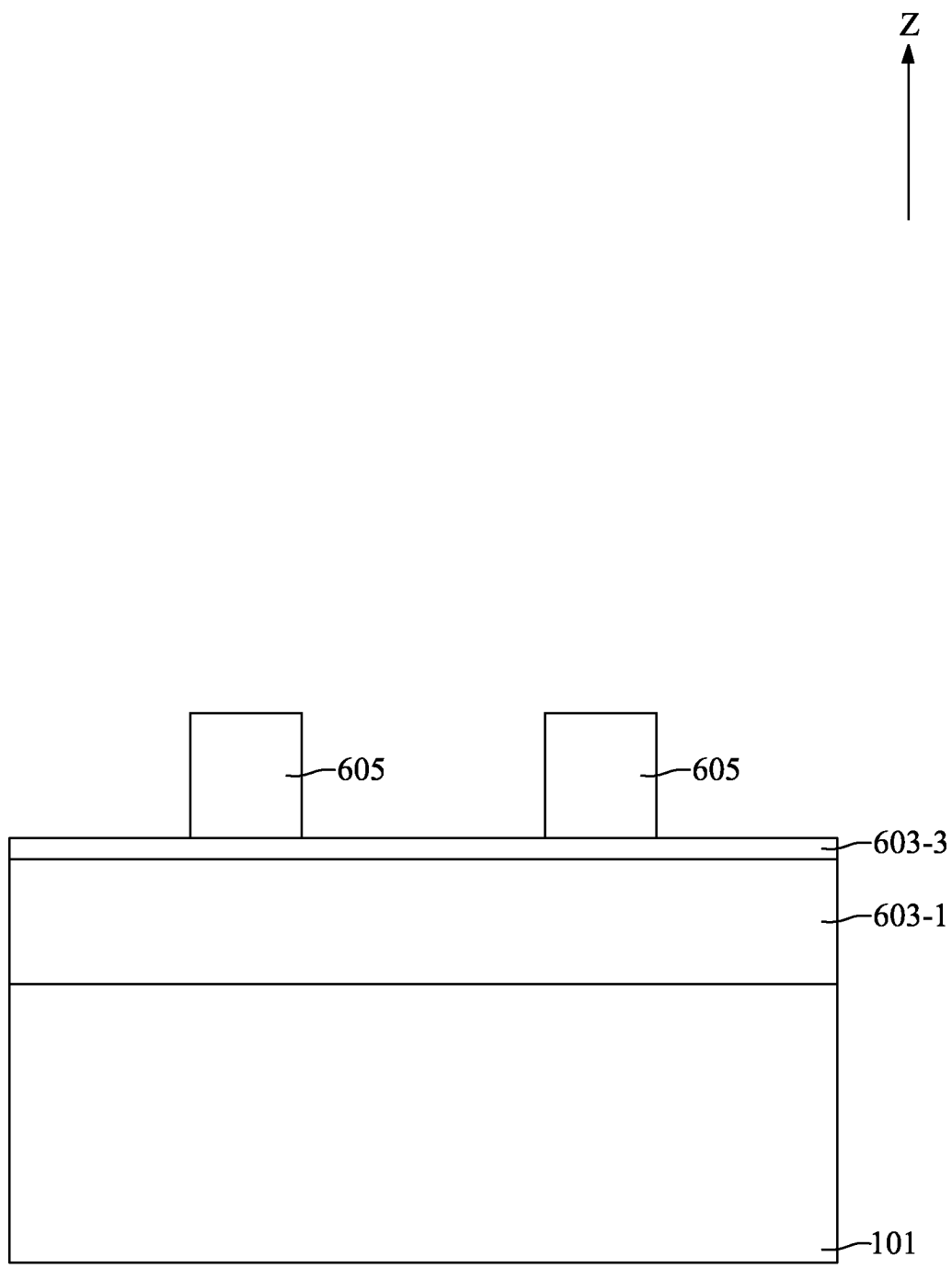
FIGS. 2 to 8 illustrate, in schematic cross-sectional view diagrams, a flow for fabricating the semiconductor device in accordance with one embodiment of the present disclosure.
Figure 3:
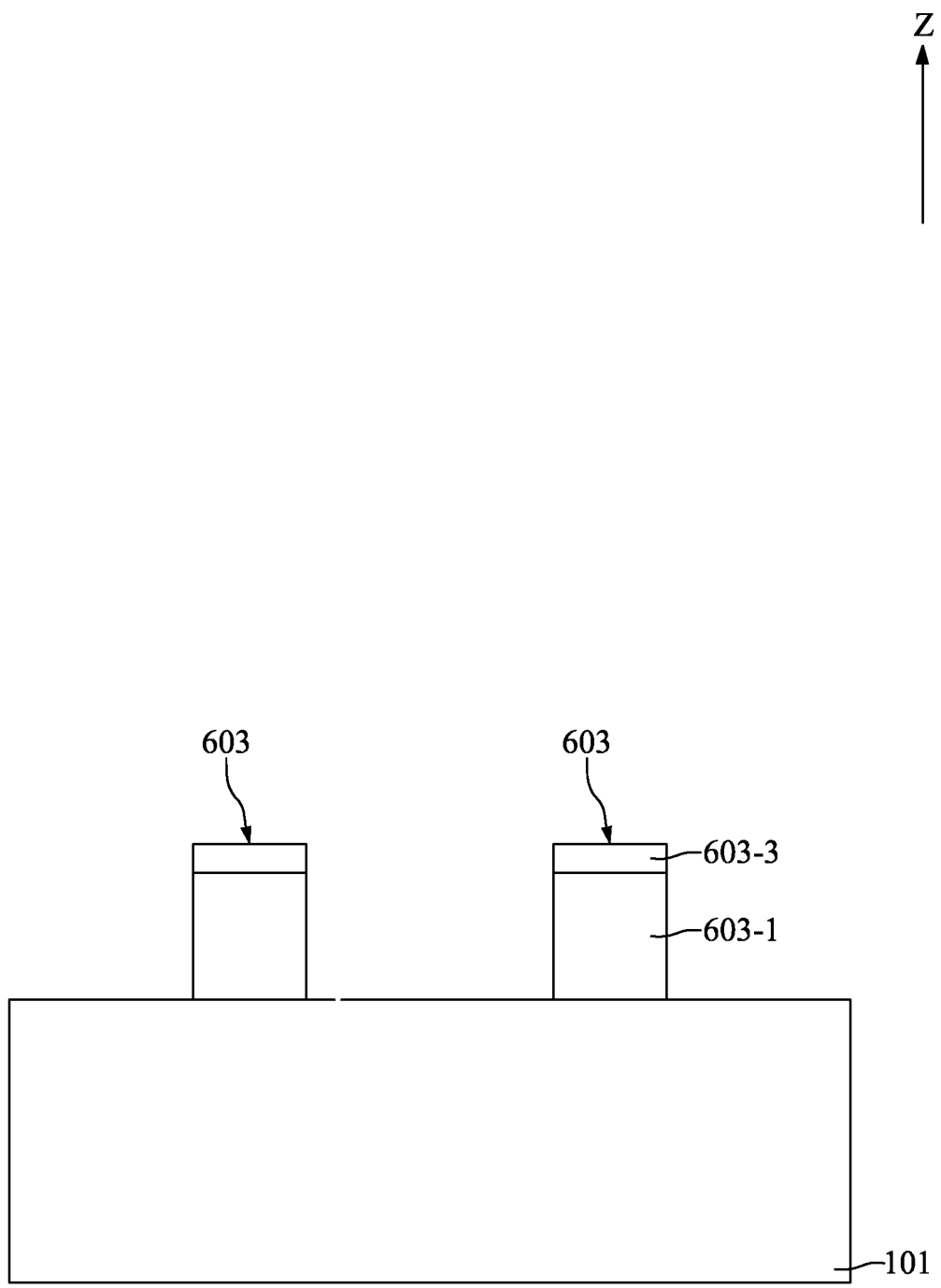

With reference to FIGS. 1 to 3, at step S11, sacrificial structures 603 may be formed on a substrate 101.

With reference to FIG. 2, a bottom sacrificial layer 603-1, a top sacrificial layer 603-3, and a first mask layer 605 may be sequentially formed on the substrate 101. The bottom sacrificial layer 603-1 may be formed of, for example, silicon carbon, or the like. The top sacrificial layer 603-3 may be a hard mask layer including silicon nitride, silicon oxynitride, or silicon nitride oxide. In some embodiments, the top sacrificial layer 603-3 may be a single layer including a dielectric anti-reflective coating layer, an organic dielectric anti-reflective coating layer, or a bottom anti-reflective coating layer. The first mask layer 605 may be a single layer including a photoresist layer. A photolithography process may be performed to pattern the first mask layer 605 and define the positions of the sacrificial structures 603. With reference to FIG. 3, an etch process, such as an anisotropic dry etch process, may be performed to remove portions of the top sacrificial layer 603-3 and portions of the bottom sacrificial layer 603-1 and concurrently form the sacrificial structures 603. After the etch process, the first mask layer 605 may be removed.

With reference to FIG. 1 and FIGS. 4 to 6, at step S13, supporting liners 303 and energy-removable layer 401 may be formed on the substrate 101, and first openings 607 may be formed in the energy-removable layer 401.

Figure 4:
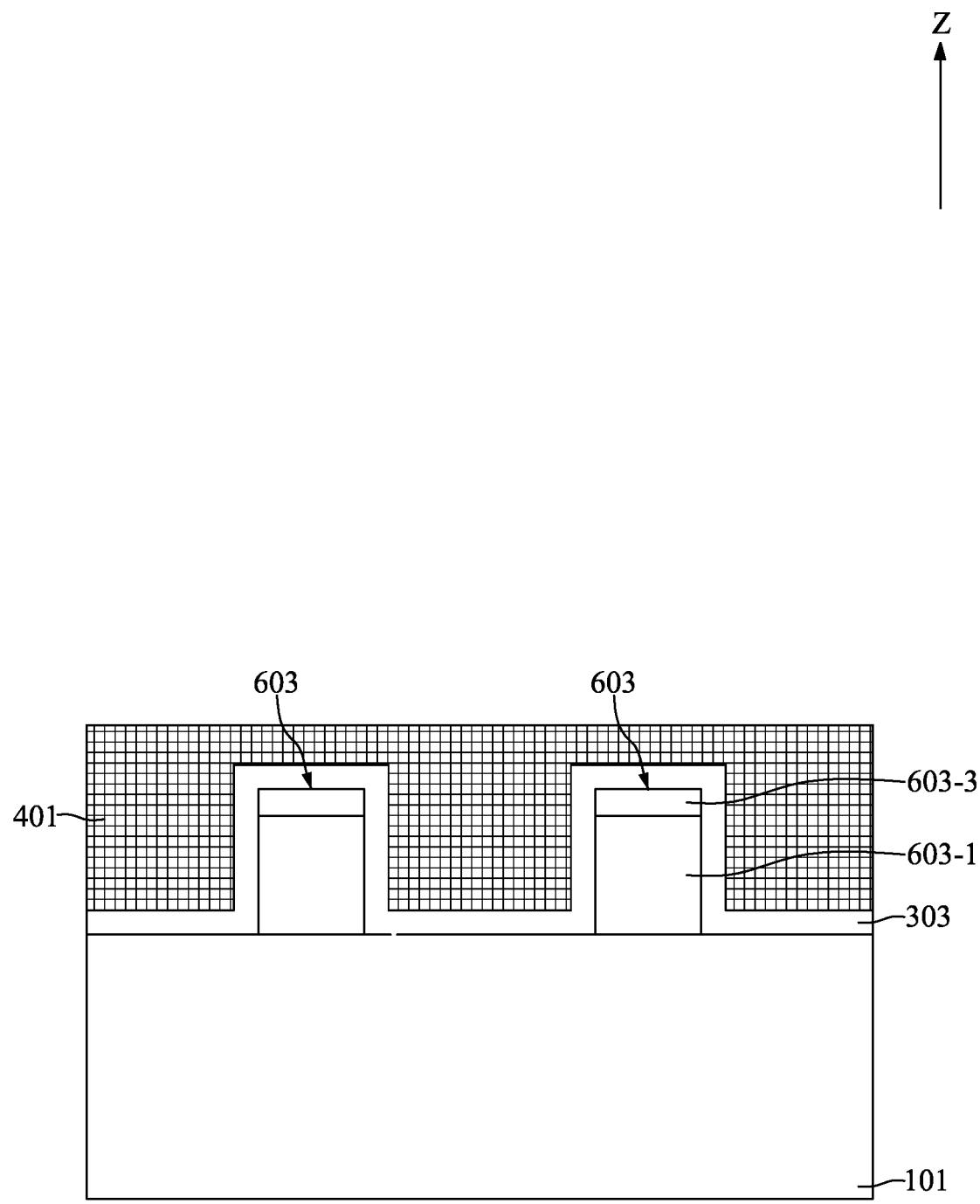
Figure 5:
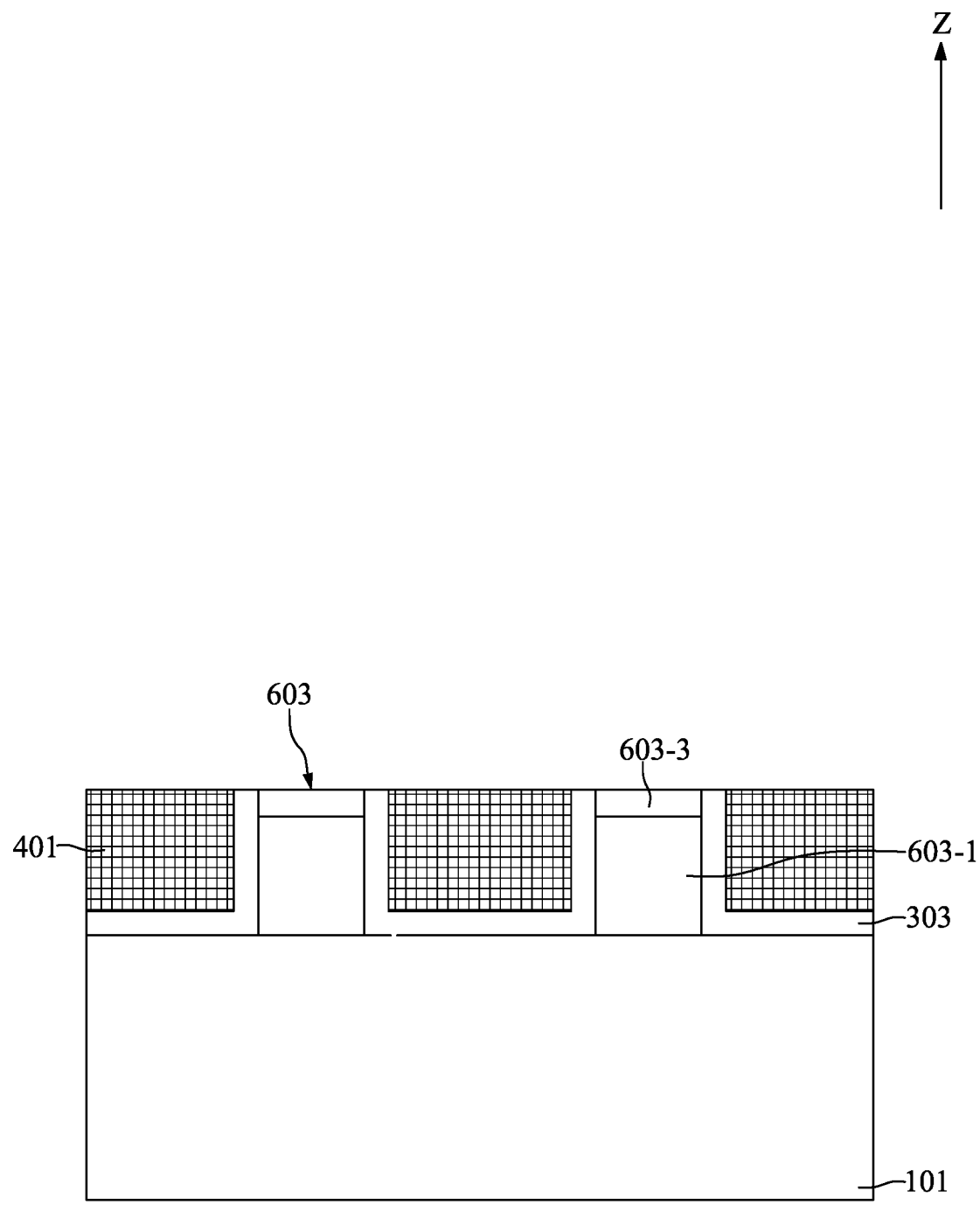
Figure 6:
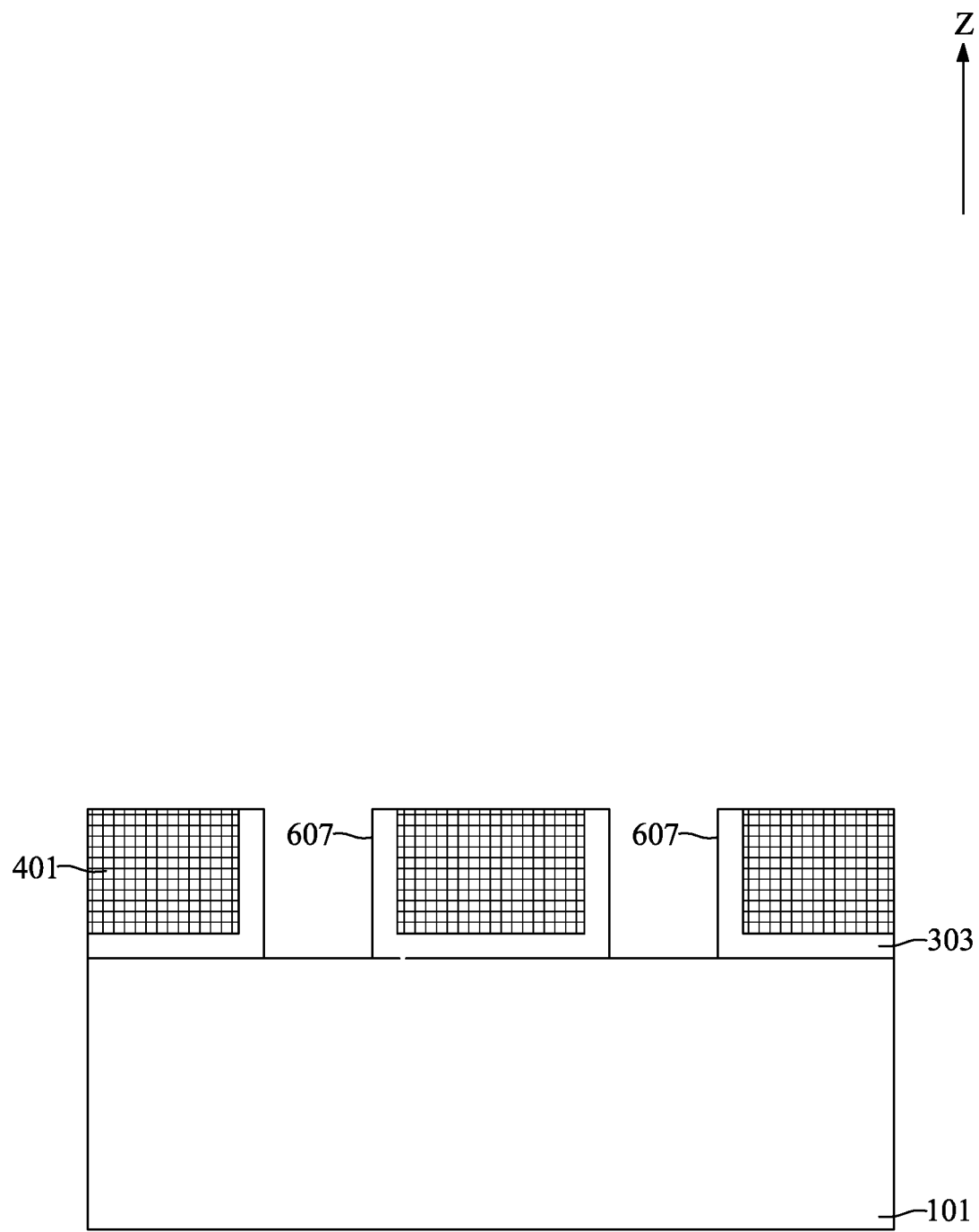

With reference to FIG. 4, the supporting liner 303 may be formed to cover the sacrificial structures 603. The supporting liner 303 may be formed of, for example, silicon nitride. Subsequently, an energy-removable layer 401 may be formed to cover the supporting liner 303. The energy-removable layer 401 may include a material such as a thermal decomposable material, a photonic decomposable material, an e-beam decomposable material, or a combination thereof. With reference to FIG. 5, a planarization process, such as chemical mechanical polishing, may be performed until the top surfaces of the sacrificial structures 603 are exposed to provide a substantially flat surface for subsequent processing steps. With reference to FIG. 6, an etch process may be performed to remove the sacrificial structures 603 and concurrently form the first openings 607 at the places where the sacrificial structures 603 previously occupied.

Figure 7:
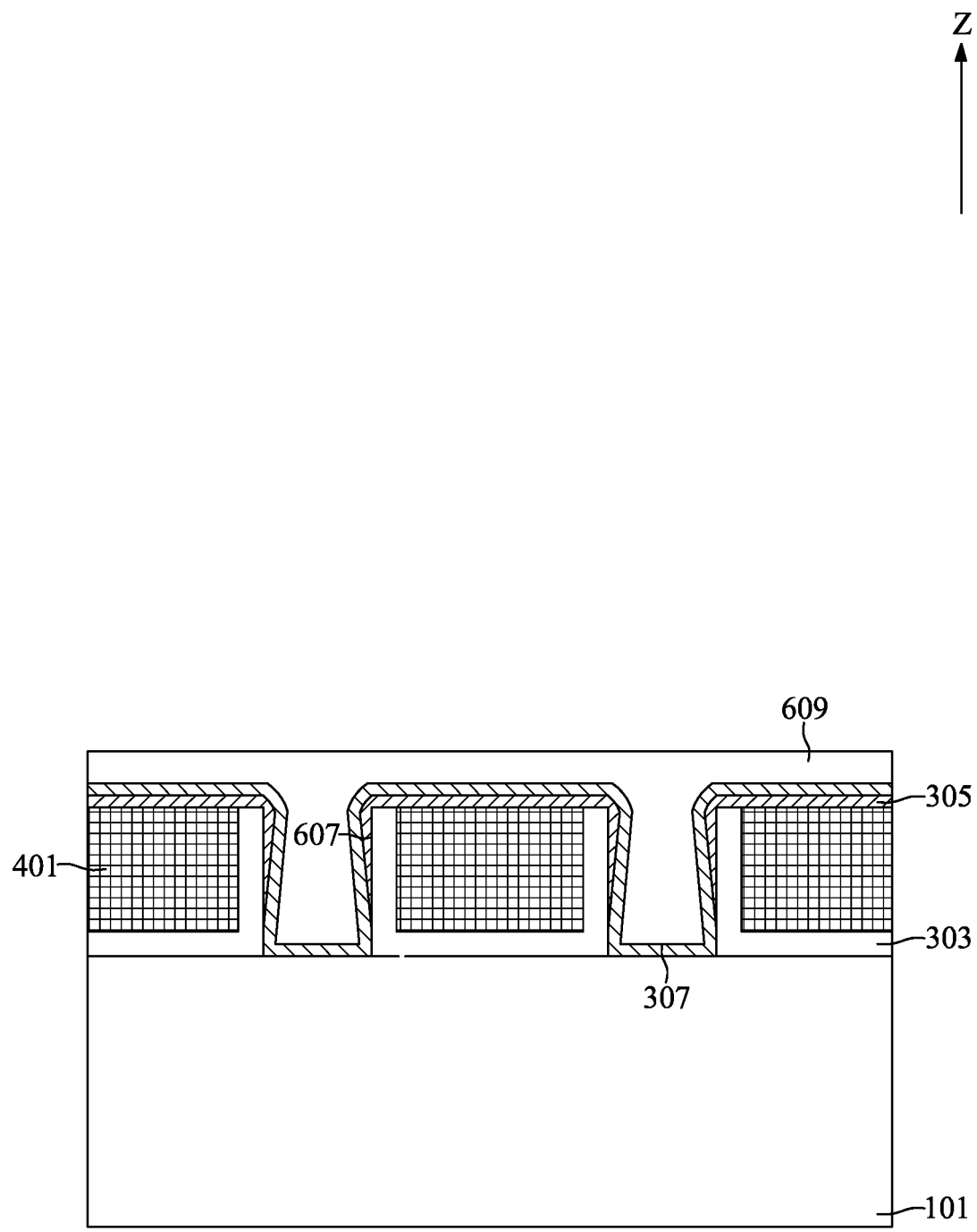
Figure 8:
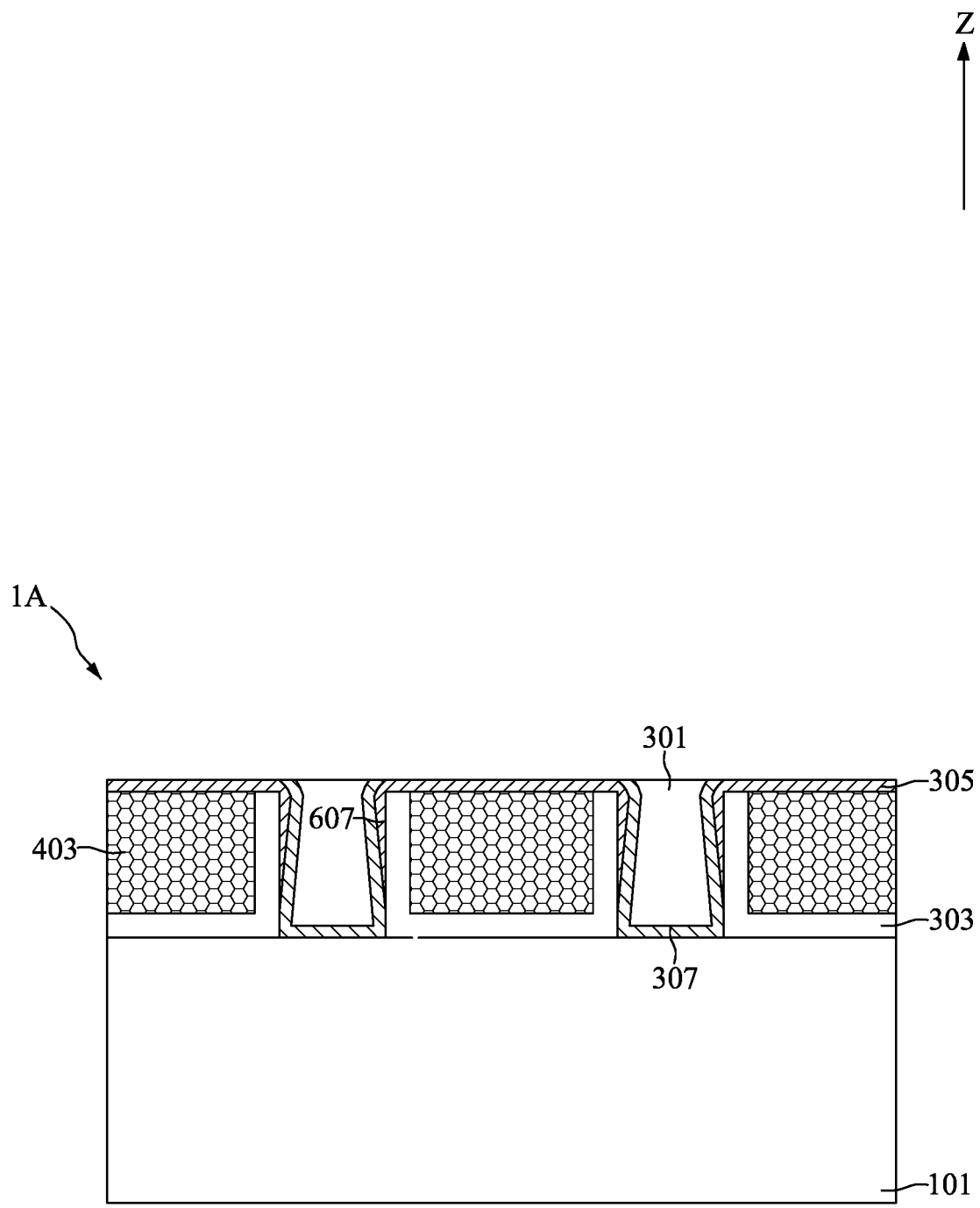

With reference to FIGS. 1, 7, and 8, at step S15, covering liners 305, a first barrier layer 307, and first conductive features 301 may be formed in the first openings 607, and an energy treatment may be performed to turn the energy-removable layer 401 into a porous insulating layer 403.

With reference to FIGS. 7 and 8, the covering liners 305 may be conformally formed on the top surface of the energy-removable layer 401, on the top surfaces of the supporting liner 303, and on the sidewalls of the first openings 607. The covering liners 305 may be formed by a deposition process such as an atomic layer deposition method precisely controlling an amount of a first precursor of the atomic layer deposition method. The covering liners 305 may be formed of, for example, aluminum oxide, hafnium oxide, zirconium oxide, titanium oxide, titanium nitride, tungsten nitride, silicon nitride, or silicon oxide. The first barrier layer 307 may be conformally formed on the covering liners 305 and in the first opening 607. The first barrier layer 307 may be formed of, for example, titanium nitride. A layer of first conductive material 609 may be deposited into the first opening 607 by a deposition process. The layer of first conductive material 609 may include doped polysilicon, a metal, or a metal silicide.

After the deposition process, a planarization process, such as chemical mechanical polishing, may be performed until the top surfaces of the covering liners 305 are exposed to remove excess material, provide a substantially flat surface for subsequent processing steps, and concurrently form the first conductive features 301 in the first opening 607. Subsequently, an energy source may be applied to the intermediate semiconductor device to turn the energy-removable layer 401 into the porous insulating layer 403.

The first conductive feature 301 may be employed as contacts, bit line contacts, vias, through-substrate vias, conductive lines, bit lines, capacitor contacts, landing pads, or other suitable conductive elements.

Figure 9:
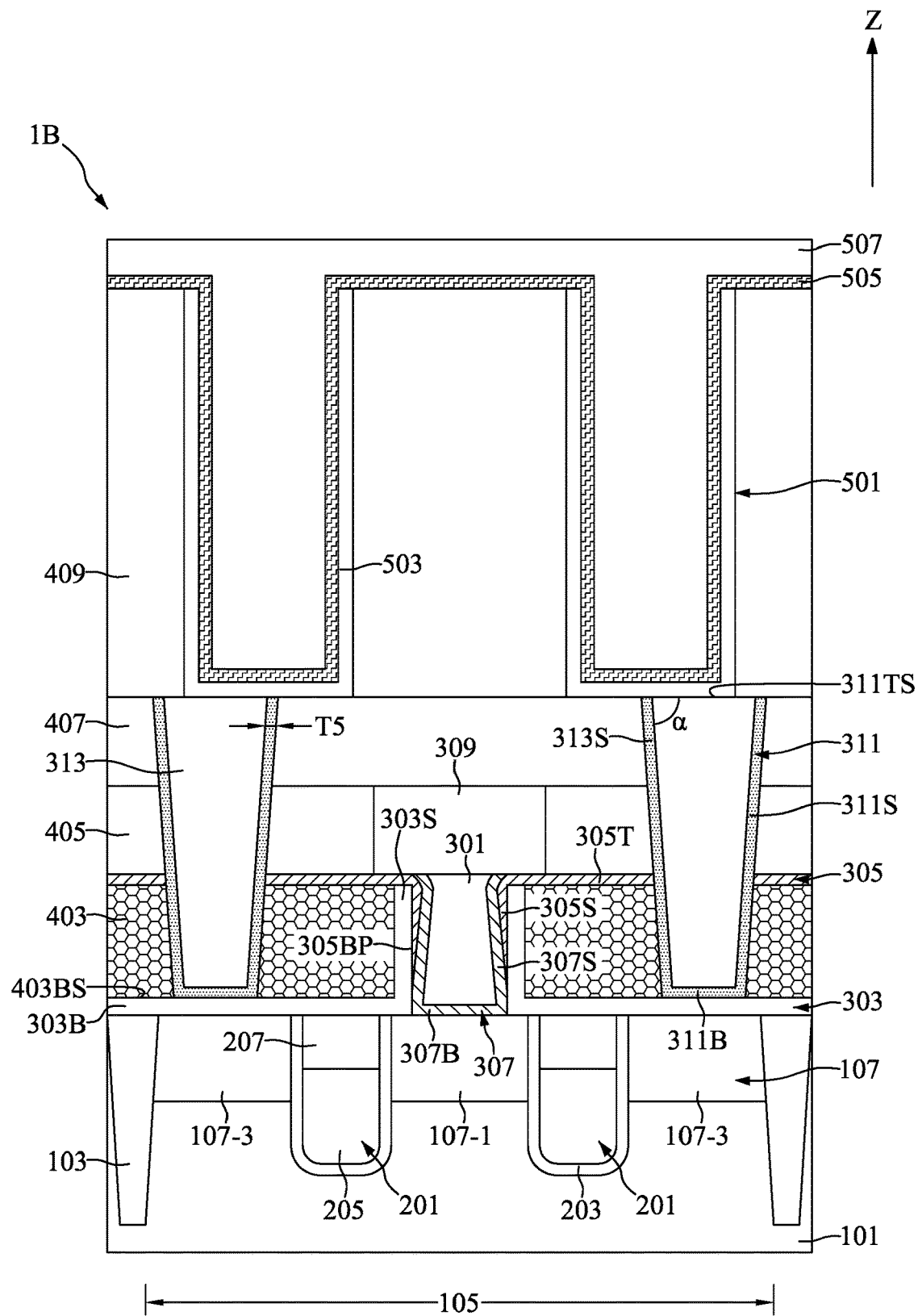
FIG. 9 illustrates, in a schematic cross-sectional diagram, a semiconductor device in accordance with another embodiment of the present disclosure.
Figure 10:
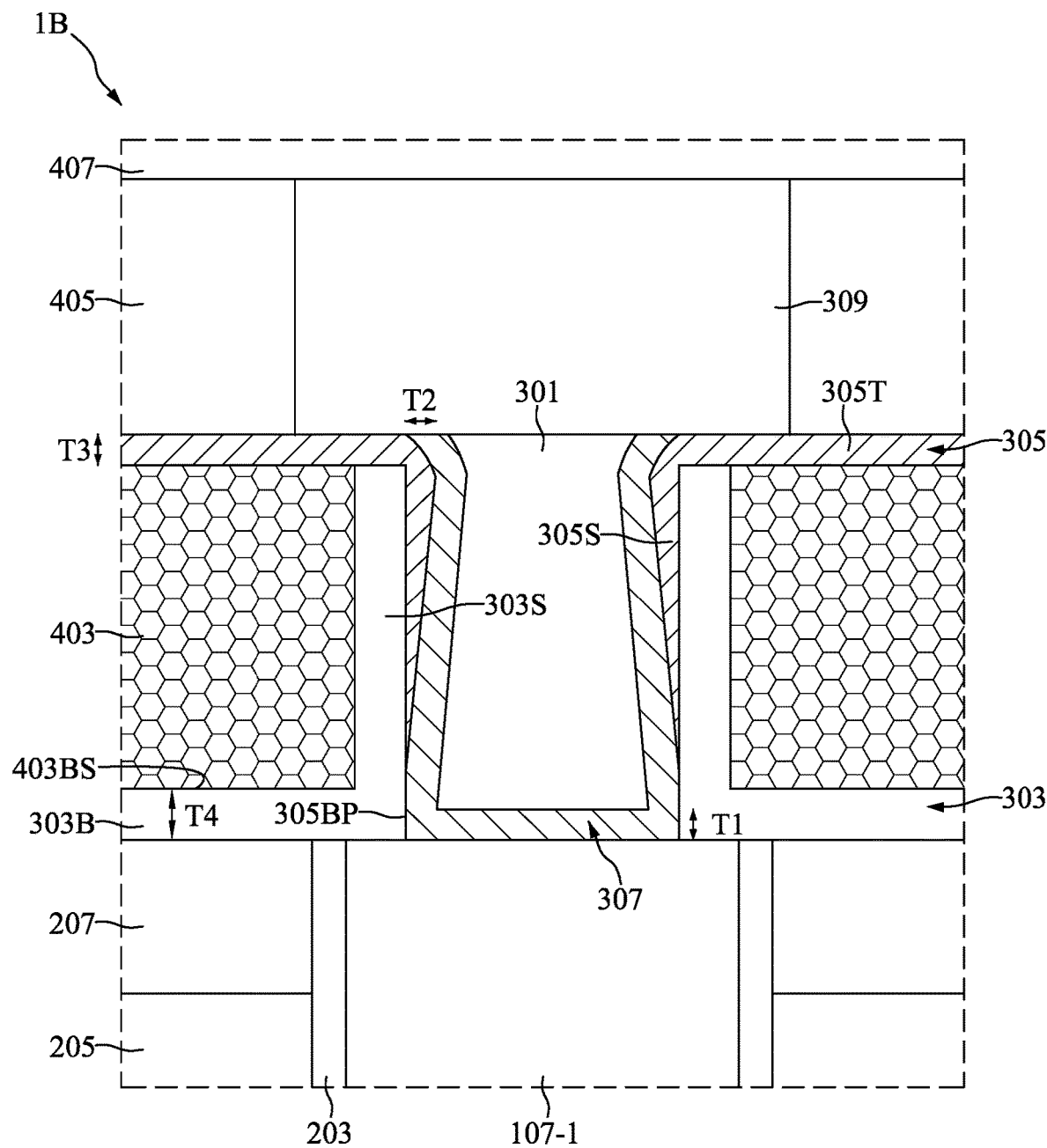
FIG. 10 illustrates, in a close-up schematic cross-sectional diagram, part of the semiconductor device in accordance with another embodiment of the present disclosure.

FIG. 9 illustrates, in a schematic cross-sectional diagram, a semiconductor device 1B in accordance with another embodiment of the present disclosure. FIG. 10 illustrates, in a close-up schematic cross-sectional diagram, part of the semiconductor device 1B in accordance with another embodiment of the present disclosure.

With reference to FIGS. 9 and 10, the semiconductor device 1B may include a substrate 101, an isolation layer 103, impurity regions 107, two word line structures 201, a first conductive feature 301, supporting liners 303, covering liners 305, a first barrier layer 307, a second conductive feature 309, second barrier layers 311, third conductive features 313, a porous insulating layer 403, insulating layers 405, 407, 409, and capacitor structures 501.

With reference to FIGS. 9 and 10, the substrate 101 may be formed of for example, silicon, germanium, silicon germanium, silicon carbon, silicon germanium carbon, gallium, gallium arsenide, indium arsenide, indium phosphorus or other IV-IV, III-V or II-VI semiconductor materials.

With reference to FIGS. 9 and 10, the isolation layer 103 may be disposed in an upper portion of the substrate 101. The isolation layer 103 may be formed of, for example, an insulating material such as silicon oxide, silicon nitride, silicon oxynitride, silicon nitride oxide, or fluoride-doped silicate. The isolation layer 103 may define an active area 105 of the substrate 101. The active area 105 may be in the isolation layer 103.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 9 and 10, the two word line structures 201 may be disposed in the upper portion of the active area 105. Each of the two word line structures 201 may include a word line dielectric layer 203, a word line electrode 205, and a word line capping layer 207. For convenience of description, only one word line structure 201 is described.

With reference to FIGS. 9 and 10, the word line dielectric layer 203 may be inwardly disposed in the upper portion of active area 105. The word line dielectric layer 203 may be formed of an insulating material having a dielectric constant of about 4.0 or greater. (All dielectric constants mentioned herein are relative to a vacuum unless otherwise noted.). The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like. The word line dielectric layer 203 may have a thickness between about 0.5 nm and about 10 nm.

With reference to FIGS. 9 and 10, the word line electrode 205 may be disposed on the word line dielectric layer 203. The word line electrode 205 may be formed of a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The word line electrode 205 may have a thickness between about 50 nm and about 500 nm. In some embodiments, a word line barrier layer (not shown) may be disposed between the word line dielectric layer 203 and the word line electrode 205. The word line barrier layer may be formed of, for example, titanium, titanium nitride, titanium silicon nitride, tantalum, tantalum nitride, tantalum silicon nitride, and combination thereof. The word line barrier layer may be employed to prevent the word line electrode 205 from flaking or spalling from the word line dielectric layer 203.

With reference to FIGS. 9 and 10, the word line capping layer 207 may be disposed on the word line electrode 205. The top surface of the word line capping layer 207 may be even with the top surface of the substrate 101. The word line capping layer 207 may be formed of, for example, silicon oxide, silicon nitride, silicon oxynitride, silicon nitride oxide, fluoride-doped silicate, or the like. In some embodiments, the word line capping layer 207 may be formed of a stacked layer including a bottom capping layer (not shown) and a top capping layer (not shown). The bottom capping layer may be disposed on the word line electrode 205. The top capping layer may be disposed on the bottom capping layer. The bottom capping layer may be formed of an insulating material having a dielectric constant of about 4.0 or greater. The top capping layer may be formed of a low dielectric-constant material such as silicon oxide, fluoride-doped silicate, or the like. The top capping layer formed of the low dielectric-constant material may reduce electric field at the top surface of the substrate 101; therefore, leakage current may be reduced.

With reference to FIGS. 9 and 10, the impurity regions 107 may be disposed in the active area 105 of the substrate 101. The impurity regions 107 may be doped with a dopant such as phosphorus, arsenic, or antimony. The impurity regions 107 may include a first impurity region 107-1 and two second impurity regions 107-3. The first impurity region 107-1 may be disposed between the two word line structures 201. The two second impurity region 107-3 may be disposed between the two word line structures 201 and the isolation layer 103.

With reference to FIGS. 9 and 10, the porous insulating layer 403 may be disposed above the substrate 101. A porosity of the porous insulating layer 403 may be between about 10% and about 50%. The porous insulating layer 403 may have a dielectric constant less than 3.0. The porous insulating layer 403 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the porous insulating layer 403 may be filled with air. As a result, a dielectric constant of the porous insulating layer 403 may be significantly lower than a layer formed of, for example, silicon oxide. Therefore, the porous insulating layer 403 may significantly reduce the parasitic capacitance between the first conductive feature 301 and the third conductive features 313. That is, the porous insulating layer 403 may significantly alleviate an interference effect between electrical signals induced or applied to the first conductive feature 301 and the third conductive features 313.

With reference to FIGS. 9 and 10, the first conductive feature 301 may be disposed in the porous insulating layer 403. The first conductive feature 301 may be formed of, for example, doped polysilicon, a metal, or a metal silicide. The first conductive feature 301 may be electrically coupled to the first impurity region 107-1. In the embodiment depicted, the first conductive feature 301 may be employed as a bit line contact but is not limited thereto. In some embodiments, an aspect ratio of the first conductive feature 301 may be between about 1:3 and about 1:15.

With reference to FIGS. 9 and 10, the first barrier layer 307 may be disposed on sidewalls of the first conductive feature 301 and the bottom surface of the first conductive feature 301. In other words, the first barrier layer 307 may be disposed between the first conductive feature 301 and the porous insulating layer 403 and between the first conductive feature 301 and the first impurity region 107-1. Specifically, the first barrier layer 307 may include a bottom segment 307B and two side segments 307S. The bottom segment 307B may be disposed on the bottom surface of the first conductive feature 301. The two side segments 307S may connect to the two ends of the bottom segment 307B and may be respectively correspondingly disposed on sidewalls of the first conductive feature 301. In some embodiments, the first barrier layer 307 may have a thickness T1 between about 10 angstroms and about 15 angstroms. In some embodiments, the thickness T1 of the first barrier layer 307 may be between about 11 angstroms and about 13 angstroms. The first barrier layer 307 may be formed of, for example, titanium, titanium nitride, titanium silicon nitride, tantalum, tantalum nitride, tantalum silicon nitride, or combination thereof. The first barrier layer 307 may be employed to prevent conductive material of the first conductive feature 301 from diffusing into the porous insulating layer 403. The first barrier layer 307 may be electrically coupled to the first impurity region 107-1 and the first conductive feature 301.

With reference to FIGS. 9 and 10, the covering liners 305 may be respectively correspondingly disposed on the two side segments 307S of the first barrier layer 307, disposed on the top surface of the porous insulating layer 403, and disposed on the top surfaces of the supporting liners 303. Specifically, the covering liners 305 may include two side segments 305S and two top segments 305T. One end of each of the two top segments 305T may connect to corresponding one of the two side segments 305S. For convenience of description, only one side segment 305S and one top segment 305T are described.

With reference to FIGS. 9 and 10, the side segment 305S of the covering liner 305 may be disposed on the upper portion of the side segment 307S of the first barrier layer 307. In other words, the side segment 305S of the covering liner 305 may be disposed between the side segment 307S of the first barrier layer 307 and the porous insulating layer 403. In some embodiments, a thickness T2 of the side segment 305S of the covering liner 305 may gradually decrease along the direction Z toward the substrate 101. In some embodiments, the bottommost point 305BP of the side segment 305S may be at a vertical level higher than a vertical level of the bottom surface 403BS of the porous insulating layer 403. In some embodiments, the bottommost point 305BP of the side segment 305S may be at a vertical level even with a vertical level of the bottom surface 403BS of the porous insulating layer 403.

With reference to FIGS. 9 and 10, the top segment 305T of the covering liner 305 may be disposed on the top surface of the porous insulating layer 403 and disposed on the top surfaces of the supporting liners 303. In some embodiments, a thickness T3 of the top segment 305T of the covering liner 305 may be between about 1 angstrom and about 30 angstroms.

In some embodiments, the covering liners 305 may be formed of, for example, aluminum oxide, hafnium oxide, zirconium oxide, titanium oxide, titanium nitride, tungsten nitride, silicon nitride, or silicon oxide. The covering liners 305 may serve as a protection layer for the porous insulating layer 403 during subsequent semiconductor processes and may avoid void produced during formation of the first conductive feature 301.

With reference to FIGS. 9 and 10, the supporting liners 303 may be disposed between the porous insulating layer 403 and the substrate 101, between the covering liners 305 and the porous insulating layer 403, and between the first barrier layer 307 and the porous insulating layer 403. The supporting liners 303 may have a thickness T4 between about 2 nm and about 20 nm. Specifically, the supporting liners 303 may include two side segments 303S and two bottom segments 303B. For convenience of description, only one side segment 303S and one bottom segment 303B are described.

With reference to FIGS. 9 and 10, the bottom segment 303B of the supporting liner 303 may be disposed on the substrate 101 and disposed under the porous insulating layer 403. In other words, the bottom segment 303B of the supporting liner 303 may be disposed between the porous insulating layer 403 and the substrate 101. The upper portion of the side segment 303S of the supporting liner 303 may be disposed on the side segment 305S of the covering liner 305. The lower portion of the side segment 303S of the supporting liner 303 may be disposed on the lower portion of the side segment 307S of the first barrier layer 307. The lower portion of the side segment 303S of the supporting liner 303 may connect to one end, which is adjacent to the first conductive feature 301, of the bottom segment 303B of the supporting liner 303.

In some embodiments, the supporting liners 303 may be formed of, for example, silicon nitride, silicon oxynitride, or the like. The supporting liners 303 may provide structural support for the porous insulating layer 403 and the first conductive feature 301.

With reference to FIGS. 9 and 10, the insulating layers 405, 407, 409 may be sequentially stacked on the covering liners 305. The insulating layers 405, 407, 409 may be formed of, for example, silicon nitride, silicon oxide, silicon oxynitride, flowable oxide, undoped silica glass, borosilica glass, phosphosilica glass, borophosphosilica glass, fluoride silicate glass, carbon-doped silicon oxide, or a combination thereof, but are not limited thereto. The insulating layers 405, 407, 409 may be formed of a same material but are not limited thereto.

With reference to FIGS. 9 and 10, the second conductive feature 309 may be disposed in the insulating layer 405 and disposed on the first conductive feature 301. The second conductive feature 309 may be electrically coupled to the first conductive feature 301. The second conductive feature 309 may be formed of, for example, a conductive material such as tungsten, aluminum, copper, nickel, or cobalt. In the embodiment depicted, the second conductive feature 309 may be employed as a bit line but is not limited thereto. In some embodiments, insulating spacers (not shown) may be disposed on sidewalls of the second conductive feature 309 to improve the process tolerance for the third conductive features 313 which will be fabricated later.

With reference to FIGS. 9 and 10, the third conductive features 313 may be respectively correspondingly disposed on the two second impurity regions 107-3 and disposed penetrating the covering liners 305, the porous insulating layer 403, the supporting liners 303, and the insulating layers 405, 407. The third conductive features 313 may be electrically coupled to the two second impurity regions 107-3. In some embodiments, the sidewalls 313S of the third conductive features 313 may have a slanted cross-sectional profile. In some embodiments, a width of the third conductive features 313 may gradually become wider from bottom to top along the direction Z. In some embodiments, an angle α between the top surface 313TS of the third conductive features 313 and the sidewall 313S of the third conductive features 313 may be between 83 degree and about 90 degree. The third conductive features 313 may be formed of, for example, doped polysilicon, titanium, titanium nitride, tantalum, tantalum nitride, tungsten, copper, aluminum or aluminum alloy. In some embodiments, an aspect ratio of the third conductive features 313 may be between about 1:3 and about 1:15. In the embodiment depicted, the third conductive features 313 may be employed as capacitor contacts.

With reference to FIGS. 9 and 10, the second barrier layers 311 may be respectively correspondingly disposed on the sidewalls 313S of the third conductive features 313 and the bottom surfaces of the third conductive features 313. Specifically, each of the second barrier layers 311 may include a bottom segment 311B and side segments 311S. The bottom segment 311B of the second barrier layer 311 may be disposed on the substrate 101 and on the bottom surface of the third conductive feature 313. The bottom segment 311B of the second barrier layer 311 may be disposed between the substrate 101 and the third conductive features 313. The side segments 311S of the second barrier layer 311 may connect to the two ends of the bottom segment 311B of the second barrier layer 311. The side segments 403S of the second barrier layer 311 may be disposed on the sidewalls 313S of the third conductive features 313. The second barrier layers 311 may have a thickness T5 between about 10 angstroms and about 15 angstroms. In some embodiments, the thickness T5 of the second barrier layers 311 may be between about 11 angstroms and about 13 angstroms.

In some embodiments, the second barrier layers 311 may be formed of, for example, titanium, titanium nitride, titanium silicon nitride, tantalum, tantalum nitride, tantalum silicon nitride, or combination thereof. The second barrier layers 311 may be employed to prevent conductive material of the second barrier layers 311 from diffusing into the insulating layers 405, 407, the covering liners 305, the porous insulating layer 403, and the supporting liners 303.

With reference to FIGS. 9 and 10, the capacitor structures 501 may be disposed in the insulating layer 409 and respectively correspondingly disposed on the third conductive features 313. The capacitor structures 501 may be electrically coupled to the third conductive features 313. The capacitor structures 501 may include capacitor bottom electrodes 503, a capacitor dielectric layer 505, and a capacitor top electrode 507.

With reference to FIGS. 9 and 10, the capacitor bottom electrodes 503 may be inwardly disposed in the insulating layer 409. The bottoms of the capacitor bottom electrodes 503 may respectively correspondingly contact the top surfaces 313TS of the third conductive features 313. The capacitor bottom electrodes 503 may be formed of, for example, doped polysilicon, metal, metal nitride, or metal silicide. The capacitor dielectric layer 505 may be disposed on the capacitor bottom electrodes 503 and cover the top surface of the insulating layers 409. The capacitor dielectric layer 505 may be formed of a single layer including an insulating material having a dielectric constant of about 4.0 or greater. The capacitor dielectric layer 505 may have a thickness between about 1 angstrom and about 100 angstroms. Alternatively, in some embodiments, the capacitor dielectric layer 505 may be formed of a stacked layer consisting of silicon oxide, silicon nitride, and silicon oxide. Alternatively, in some embodiments, the capacitor dielectric layer 505 may be formed of a stacked layer consisting of zirconium oxide, aluminum oxide, and zirconium oxide. The capacitor top electrode 507 may be disposed on the capacitor dielectric layer 505. The capacitor top electrode 507 may be formed of, for example, doped polysilicon, silicon germanium alloy, or metal.

Figure 11:
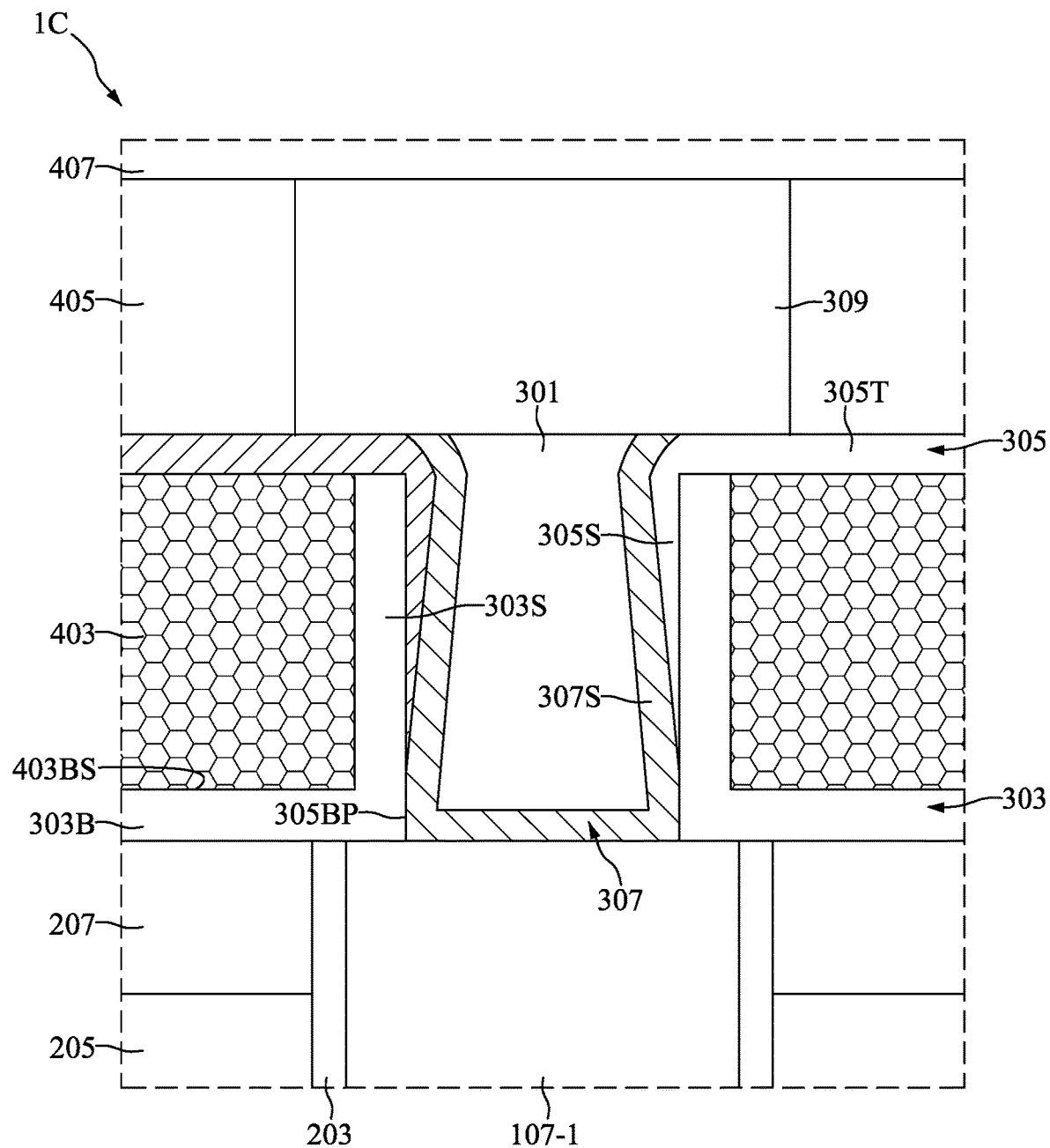
FIG. 11 illustrates, in a close-up schematic cross-sectional view diagram, a semiconductor device in accordance with another embodiment of the present disclosure.
Figure 12:
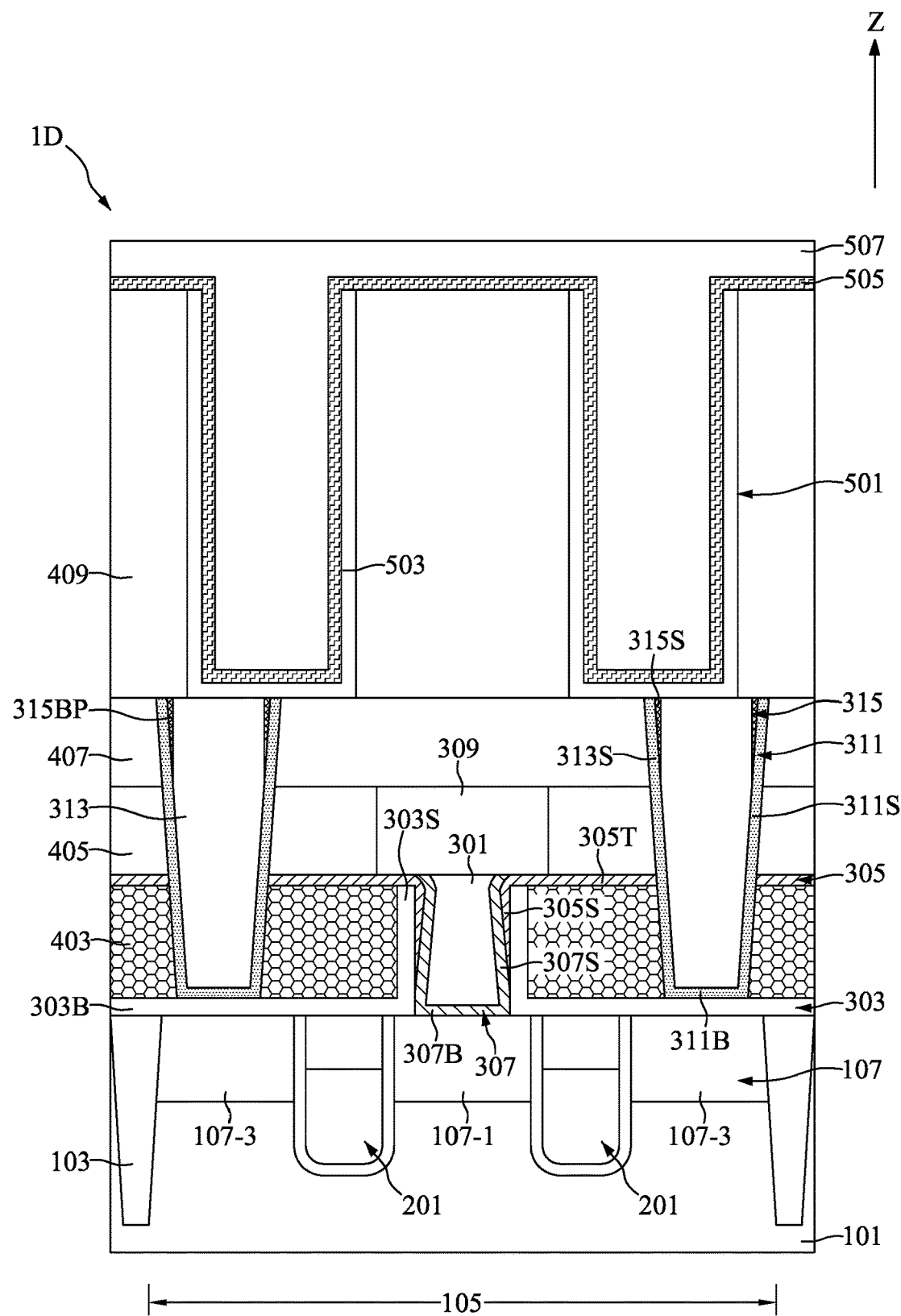
FIG. 12 illustrates, in a schematic cross-sectional diagram, a semiconductor device in accordance with another embodiment of the present disclosure.
Figure 13:
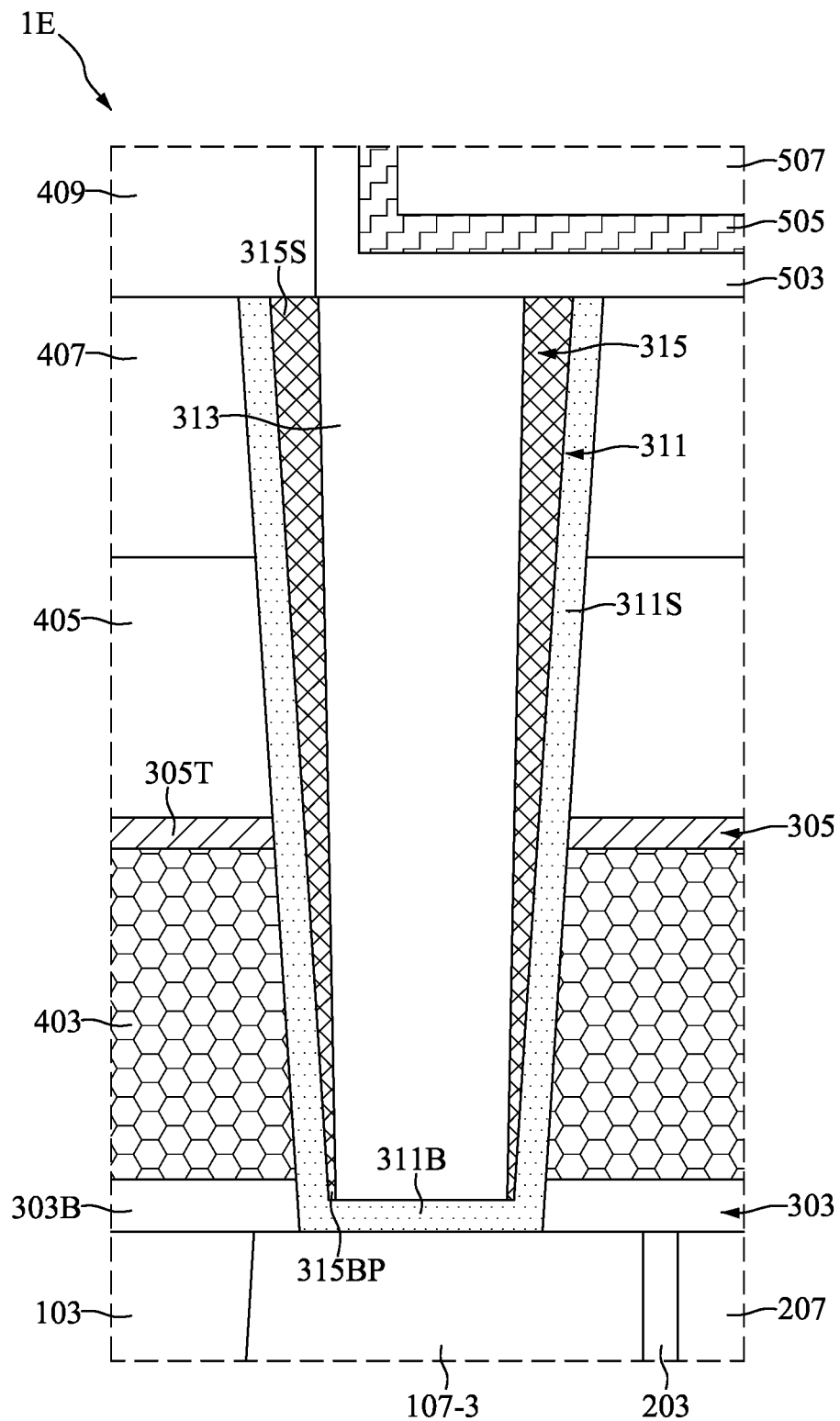
FIG. 13 illustrates, in a close-up schematic cross-sectional view diagram, a semiconductor device in accordance with another embodiment of the present disclosure.

FIG. 11 illustrates, in a close-up schematic cross-sectional view diagram, a semiconductor device 1C in accordance with another embodiment of the present disclosure. FIG. 12 illustrates, in a schematic cross-sectional diagram, a semiconductor device 1D in accordance with another embodiment of the present disclosure. FIG. 13 illustrates, in a close-up schematic cross-sectional view diagram, a semiconductor device 1E in accordance with another embodiment of the present disclosure.

With reference to FIG. 11, in the semiconductor device 1C, the bottommost points 305BP of the side segments 305S of the covering liners 305 may contact the first impurity region 107-1. The side segment 307S of the first barrier layer 307 may be opposite to the side segment 303S of the supporting liner 303 with the side segment 305S of the covering liner 305 interposed therebetween.

With reference to FIG. 12, in the semiconductor device 1D, the adjustment layers 315 may be disposed between the third conductive features 313 and the side segments 311S of the second barrier layers 311. Specifically, the adjustment layers 315 may be respectively correspondingly disposed on upper portions of the side segments 311S of the second barrier layers 311. The bottommost points 315BP of the bottommost points 315BP may be at a vertical level higher than a vertical level of the bottom segment 311B of the second barrier layers 311.

In some embodiments, the adjustment layers 315 may be formed of any suitable metal, metal oxide, metal carbide, metal nitride, or combination thereof. For example, the adjustment layers 315 may be formed of aluminum carbide, aluminum nitride, tungsten carbide, or tungsten nitride. In some embodiments, the adjustment layers 315 may be formed of, for example, aluminum oxide, hafnium oxide, zirconium oxide, titanium oxide, titanium nitride, tungsten nitride, silicon nitride, or silicon oxide.

With reference to FIG. 13, in the semiconductor device 1E, the bottommost points 315BP of the adjustment layers 315 may contact the bottom segments 311B of the second barrier layers 311.

With the presence of the adjustment layers 315, the third conductive features 313 may be formed without any void. Therefore, the yield of the semiconductor device 1D/1E may be improved.

Figure 14:
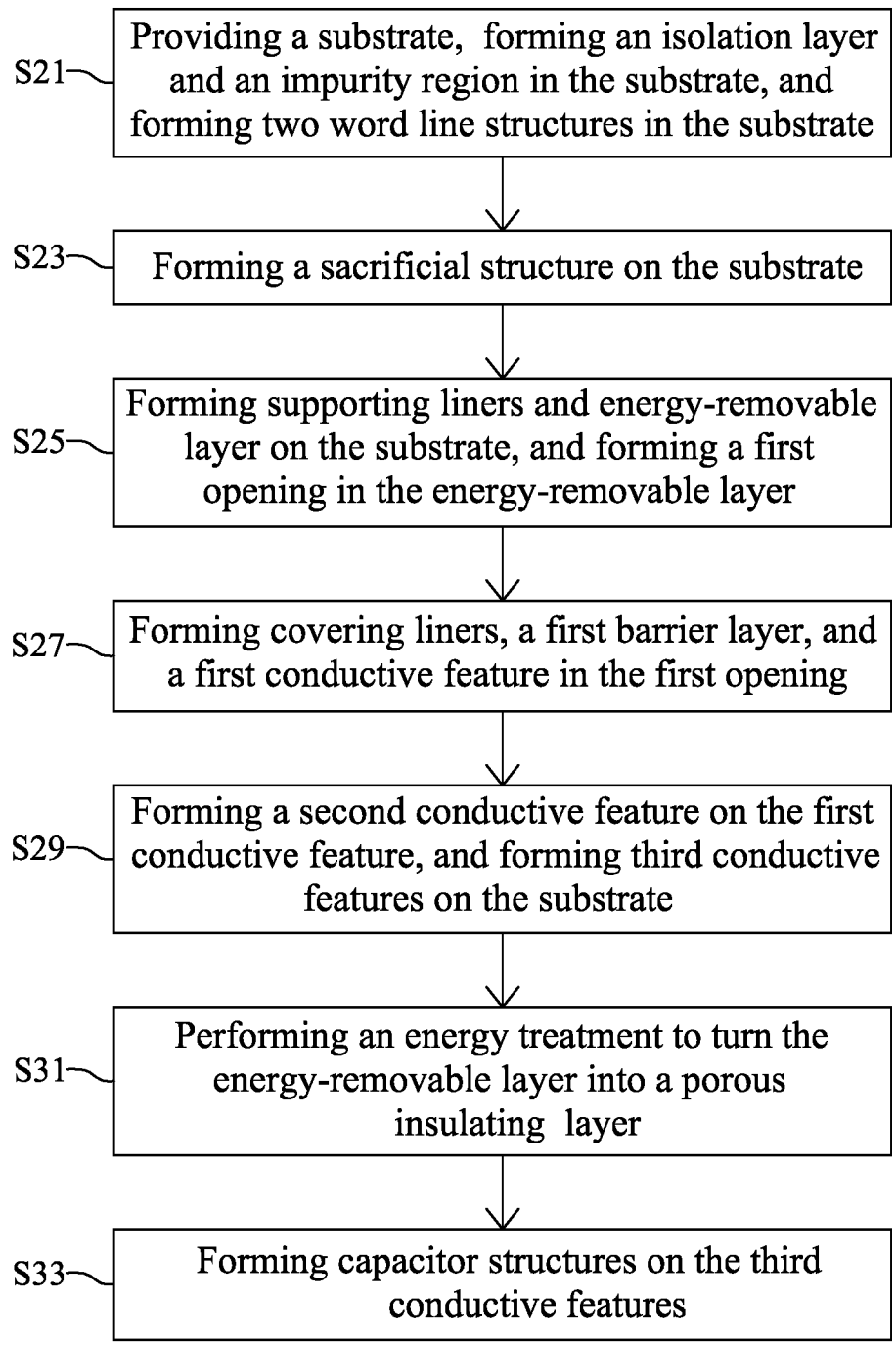
FIG. 14 illustrates, in a flowchart diagram form, a method for fabricating a semiconductor device in accordance with another embodiment of the present disclosure.

FIG. 14 illustrates, in a flowchart diagram form, a method 20 for fabricating a semiconductor device 1B in accordance with another embodiment of the present disclosure. FIGS. 15 to 31 illustrate, in schematic cross-sectional view diagrams, a flow for fabricating the semiconductor device 1B in accordance with another embodiment of the present disclosure.

Figure 15:
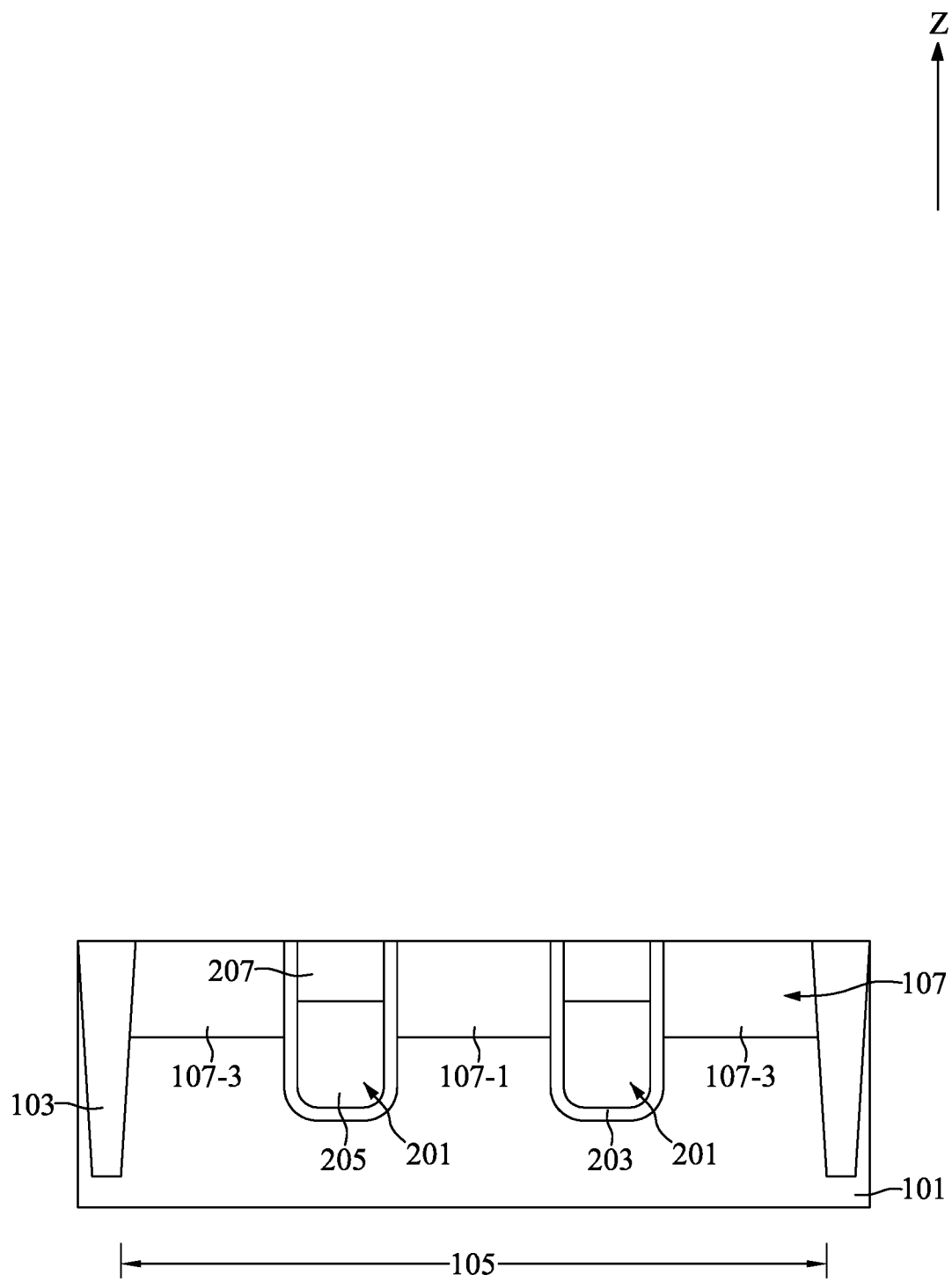
FIGS. 15 to 31 illustrate, in schematic cross-sectional view diagrams, a flow for fabricating the semiconductor device in accordance with another embodiment of the present disclosure.

With reference to FIGS. 14 and 15, at step S21, a substrate 101 may be provided and an isolation layer 103, an impurity region 107 may be formed in the substrate 101, and two word line structures 201 may be formed in the substrate 101.

With reference to FIG. 15, the isolation layer 103 may be formed in the substrate 101 and define an active area 105. An implantation process may be performed to dope a dopant into the upper portion of the active area 105 and concurrently form the impurity region 107 in the active area 105. The dopant may be phosphorus, arsenic, or antimony. The two word line structures 201 may divide the impurity region 107 into a first impurity region 107-1 and two second impurity region 107-3.

Figure 16:
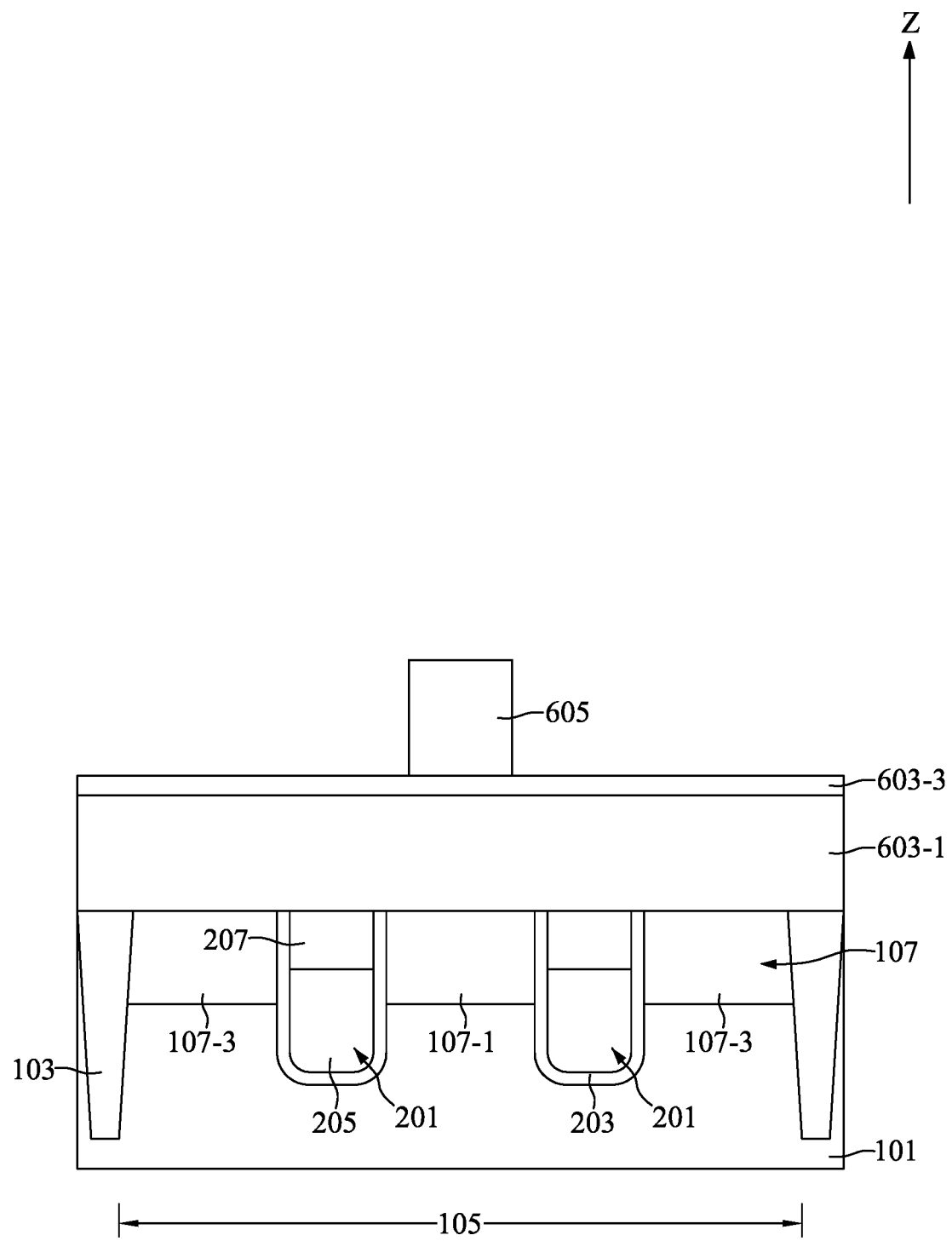
Figure 17:
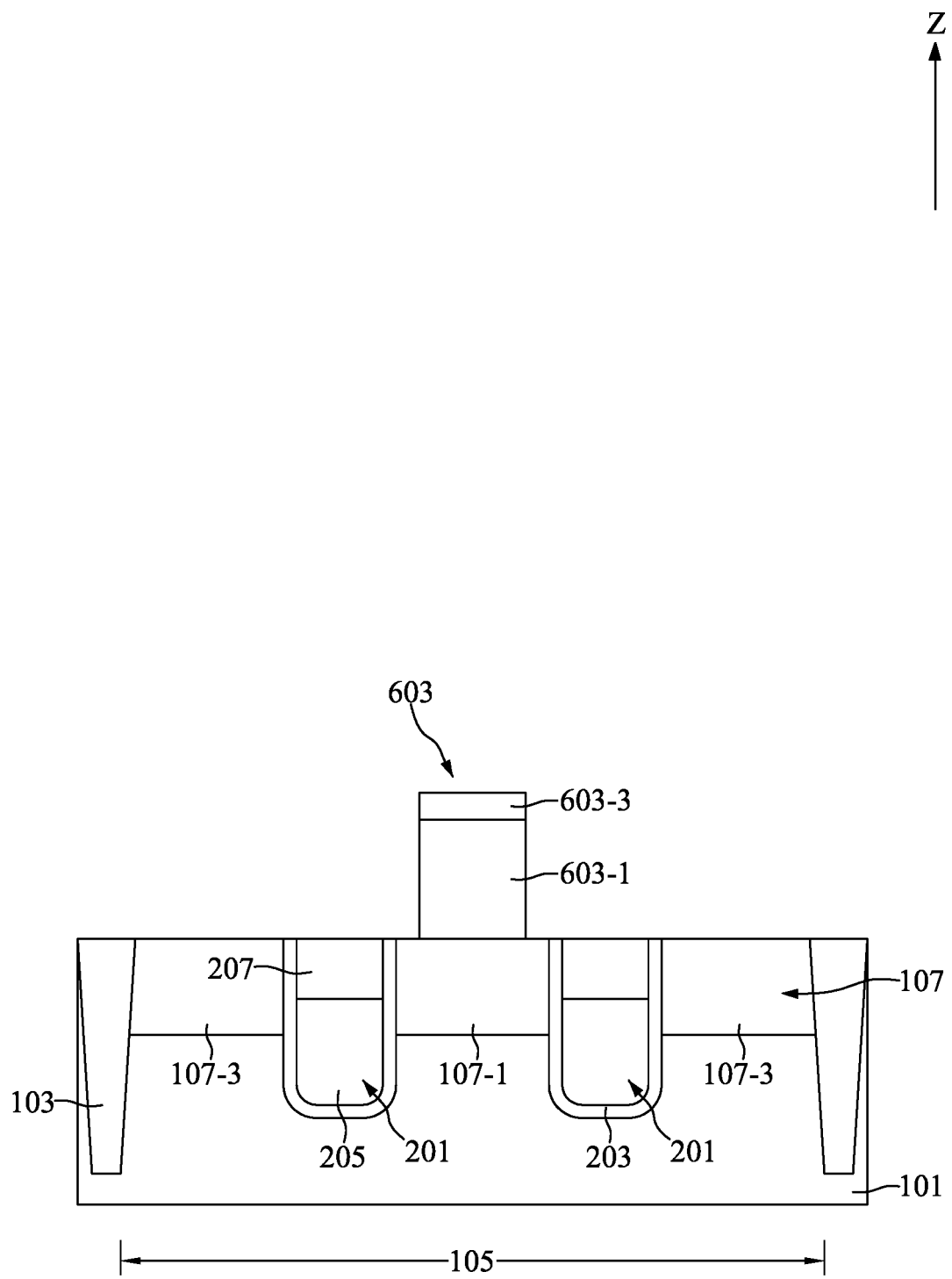

With reference to FIGS. 14, 16, and 17, at step S23, a sacrificial structure 603 may be formed on the substrate 101.

With reference to FIG. 16, a bottom sacrificial layer 603-1 and a top sacrificial layer 603-3 may be sequentially formed on the substrate 101. In some embodiments, the bottom sacrificial layer 603-1 may be formed of, for example, silicon carbon, or the like. In some embodiments, the top sacrificial layer 603-3 may be a hard mask layer including silicon nitride, silicon oxynitride, or silicon nitride oxide. In some embodiments, the top sacrificial layer 603-3 may be a single layer including a dielectric anti-reflective coating layer, an organic dielectric anti-reflective coating layer, or a bottom anti-reflective coating layer. A thickness of the top sacrificial layer 603-3 may be between about 240 angstroms and about 630 angstroms. In some embodiments, the top sacrificial layer 603-3 may be a stacked layer including, form bottom to top, a dielectric anti-reflective coating layer and a bottom anti-reflective coating layer.

With reference to FIG. 16, a first mask layer 605 may be formed on the top sacrificial layer 603-3. In some embodiments, the first mask layer 605 may be a single layer including a photoresist layer. In some embodiments, the first mask layer 605 may be a stacked layer including, form bottom to top, a photoresist layer and a top anti-reflective coating layer. A photolithography process may be performed to pattern the first mask layer 605 and define the position of the sacrificial structure 603.

With reference to FIG. 17, an etch process, such as an anisotropic dry etch process, may be performed to remove portions of the top sacrificial layer 603-3 and portions of the bottom sacrificial layer 603-1 and concurrently form the sacrificial structure 603 on the first impurity region 107-1. The first mask layer 605 may be removed after the etch process.

With reference to FIG. 14 and FIGS. 18 to 20, at step S25, supporting liners 303 and energy-removable layer 401 may be formed on the substrate 101, and a first opening 607 may be formed in the energy-removable layer 401.

Figure 18:
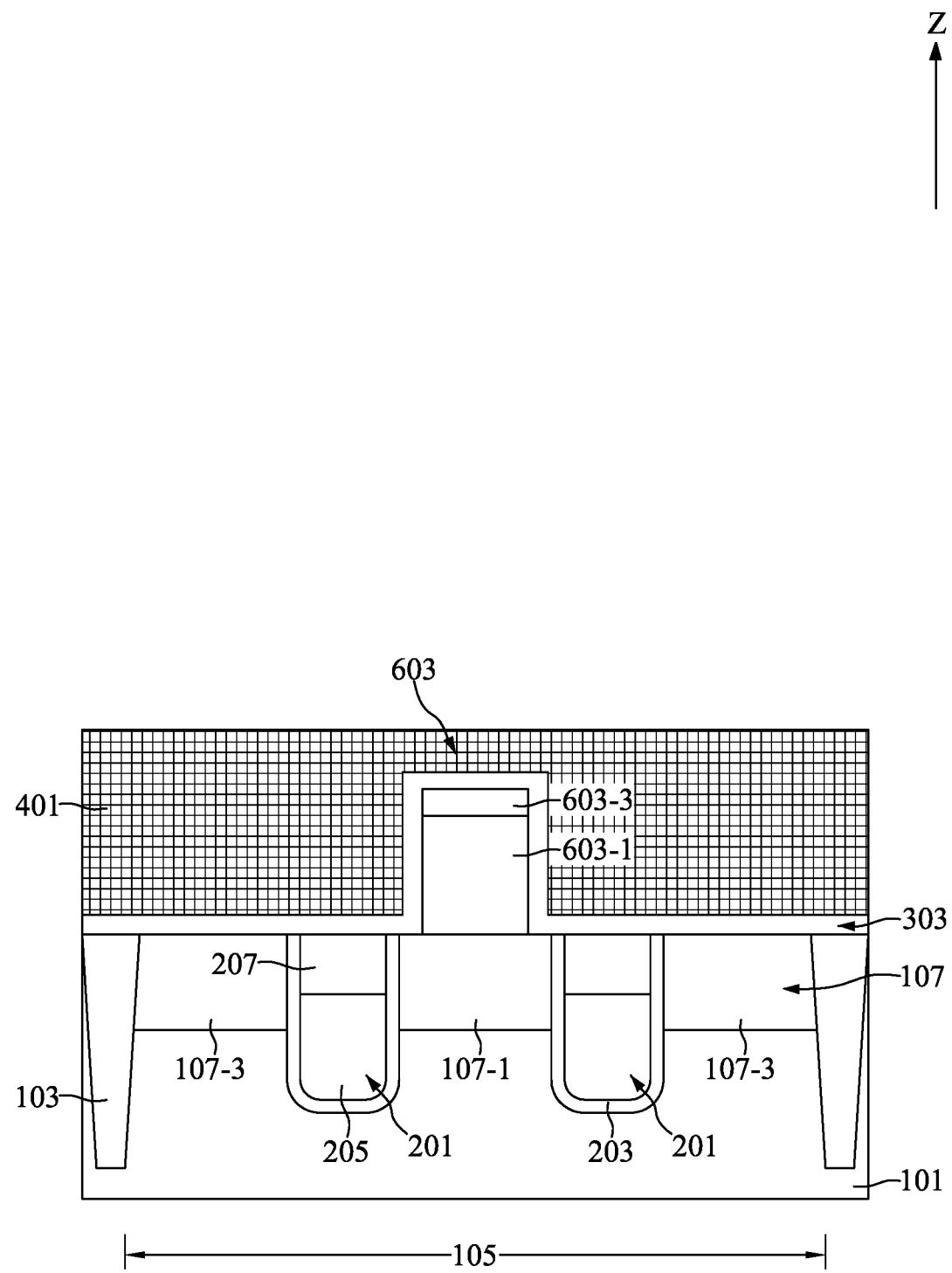

With reference to FIG. 18, the supporting liner 303 may be formed on the top surface of the substrate 101, on the sidewalls of the sacrificial structure 603, and on the top surface of the sacrificial structure 603. Subsequently, an energy-removable layer 401 may be formed to cover the supporting liner 303. The energy-removable layer 401 may include a material such as a thermal decomposable material, a photonic decomposable material, an e-beam decomposable material, or a combination thereof. For example, the energy-removable layer 401 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material.

Figure 19:
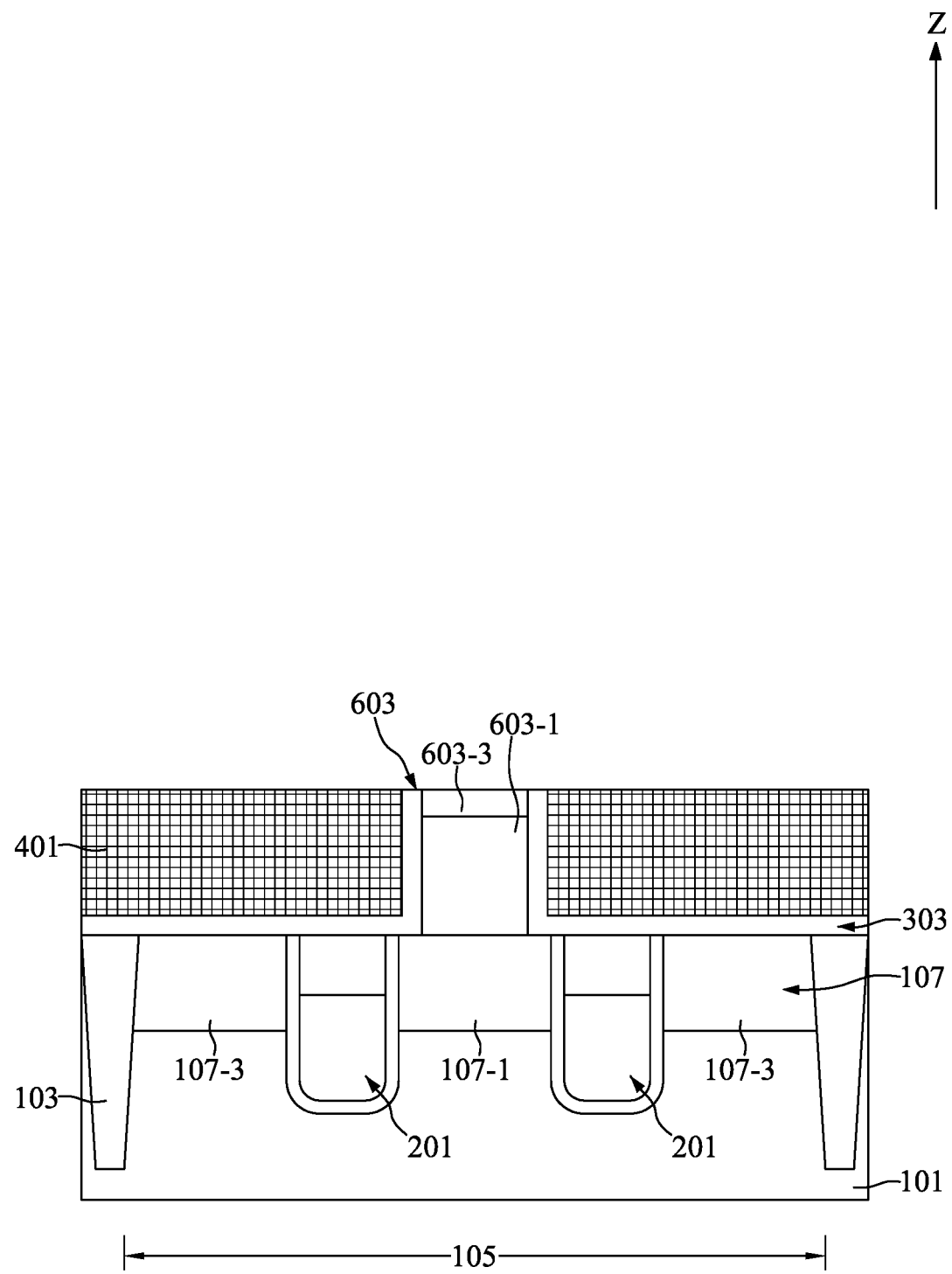

With reference to FIG. 19, a planarization process, such as chemical mechanical polishing, may be performed until the top surface of the sacrificial structure 603 is exposed to provide a substantially flat surface for subsequent processing steps. After the planarization process, the supporting liner 303 formed on the top surface of the top sacrificial layer 603-3 may be removed, and the supporting liner 303 may be divided into multiple portions.

Figure 20:
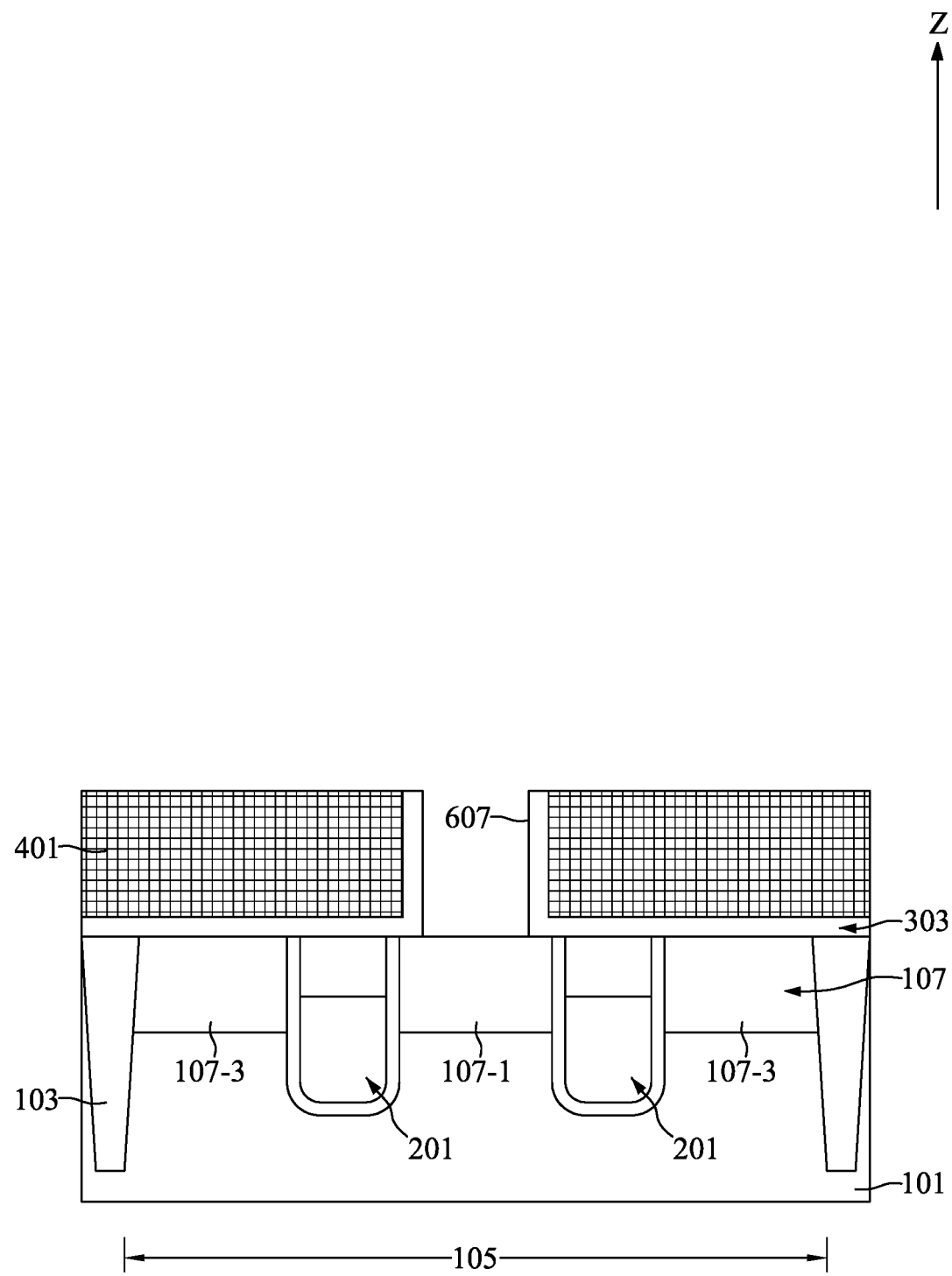

With reference to FIG. 20, an etch process may be performed to remove the sacrificial structure 603 and concurrently form the first opening 607 at the place where the sacrificial structure 603 previously occupied. The top surface of the impurity region 107-1 may be exposed through the first opening 607.

With reference to FIG. 14 and FIGS. 21 to 24, at step S27, covering liners 305, a first barrier layer 307, and a first conductive feature 301 may be formed in the first opening 607.

Figure 21:
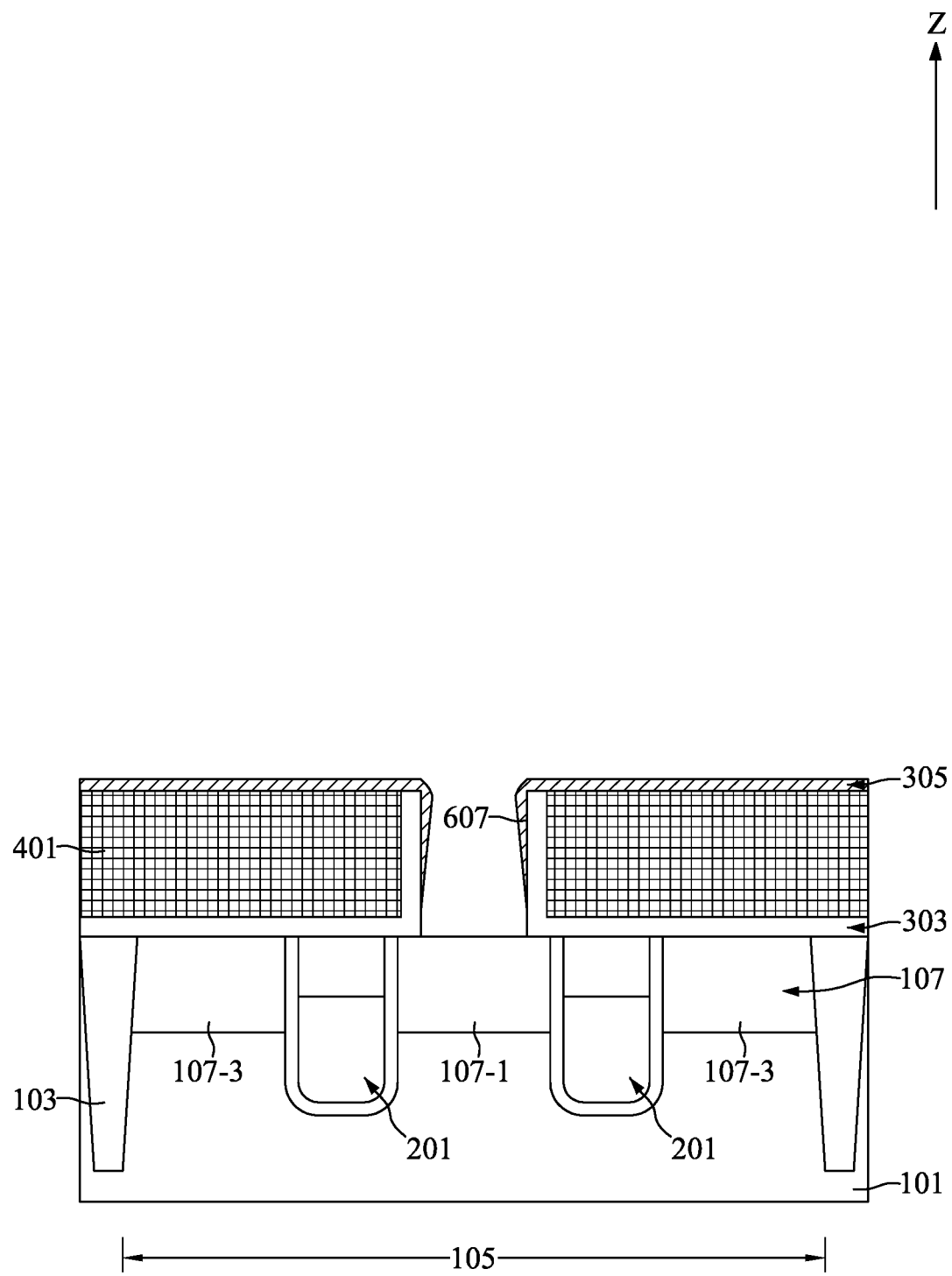

With reference to FIG. 21, the covering liners 305 may be conformally formed on the top surface of the energy-removable layer 401, on the top surfaces of the supporting liners 303, and on the sidewalls of the first opening 607. The supporting liners 303 and the covering liners 305 may provide structural support for the energy-removable layer 401. The covering liners 305 may also employed as a protection layer for the energy-removable layer 401 during subsequent semiconductor processes.

In some embodiments, the covering liners 305 may be formed by a deposition process such as an atomic layer deposition method precisely controlling an amount of a first precursor of the atomic layer deposition method. The covering liners 305 may be formed of, for example, aluminum oxide, hafnium oxide, zirconium oxide, titanium oxide, titanium nitride, tungsten nitride, silicon nitride, or silicon oxide. When the covering liners 305 are formed of aluminum oxide, the first precursor may be trimethylaluminum and a second precursor may be water or ozone. When the covering liners 305 are formed of hafnium oxide, the first precursor may be hafnium tetrachloride, hafnium tert-butoxide, hafnium dimethylamide, hafnium ethylmethylamide, hafnium diethylamide, or hafnium methoxy-t-butoxide and the second precursor may be water or ozone. When the covering liners 305 are formed of zirconium oxide, the first precursor may be zirconium tetrachloride and the second precursor may be water or ozone. When the covering liners 305 are formed of titanium oxide, the first precursor may be titanium tetrachloride, tetraethyl titanate, or titanium isopropoxide and the second precursor may be water or ozone. When the covering liners 305 are formed of titanium nitride, the first precursor may be titanium tetrachloride and ammonia. When the covering liners 305 are formed of tungsten nitride, the first precursor may be tungsten hexafluoride and ammonia. When the covering liners 305 are formed of silicon nitride, the first precursor may be silylene, chlorine, ammonia, and/or dinitrogen tetrahydride. When the covering liners 305 are formed of silicon oxide, the first precursor may be silicon tetraisocyanate or $CH_3OSi(NCO)_3$ and the second precursor may be hydrogen or ozone.

Figure 22:
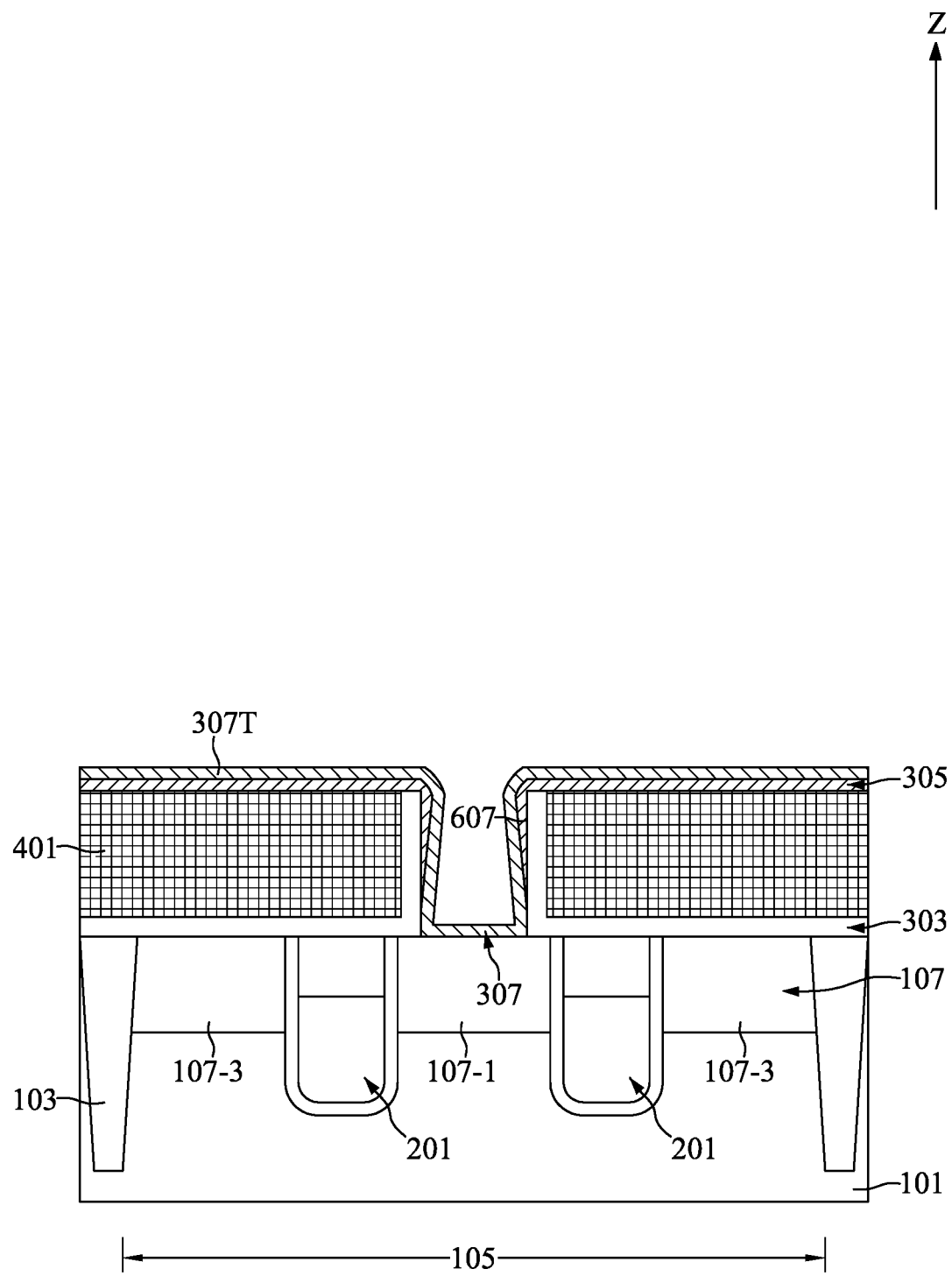

With reference to FIG. 22, the first barrier layer 307 may be conformally formed on the covering liners 305 and in the first opening 607. A stabilization process, which includes a tilted aluminum implantation process and an oxidation process, may be optionally performed on the first barrier layer 307. The tilted aluminum implantation process may insert aluminum into the first barrier layer 307. The oxidation process may oxidize the aluminum inserted into the first barrier layer 307 and may stabilize the first barrier layer 307.

Figure 23:
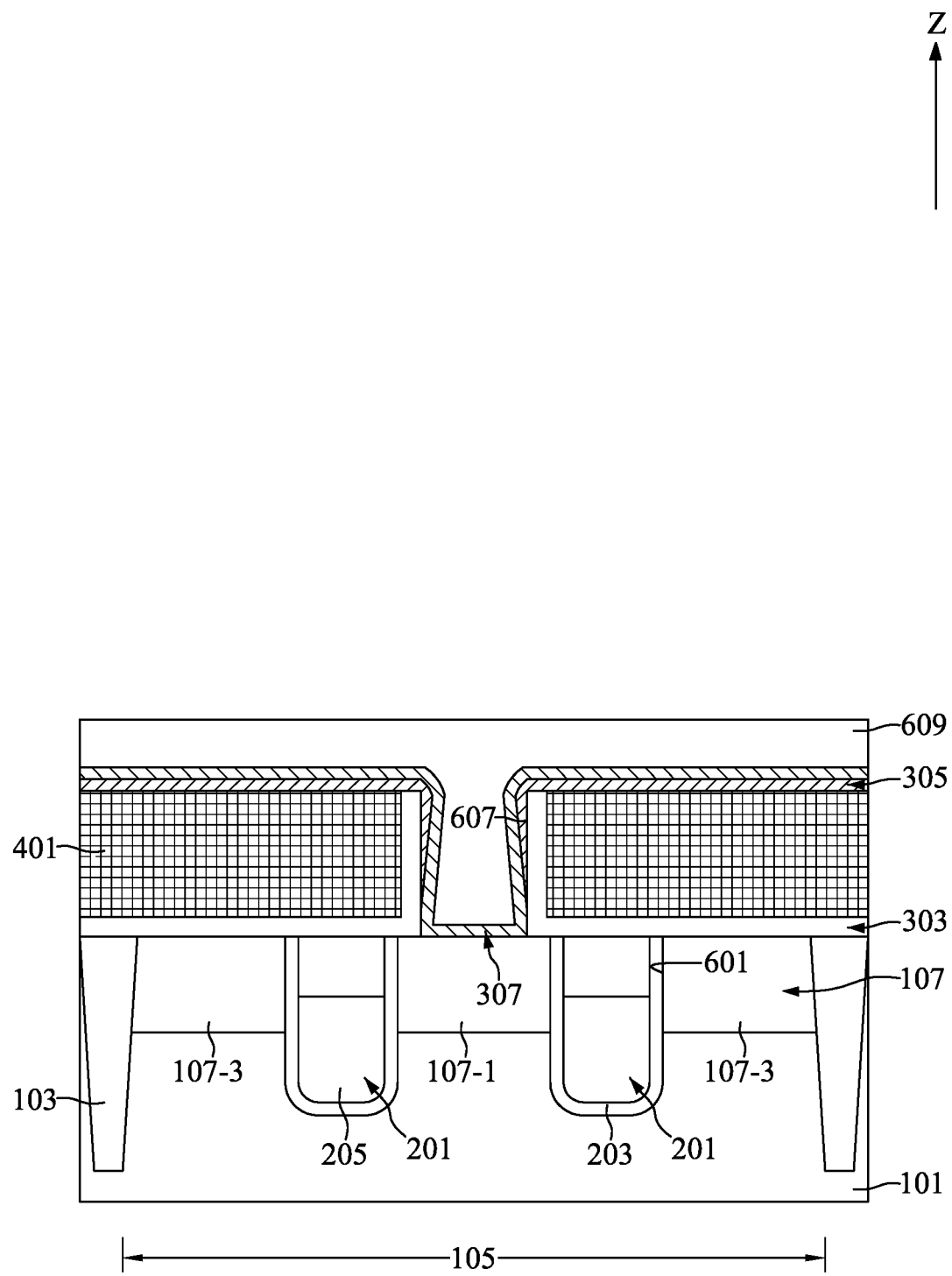
Figure 24:
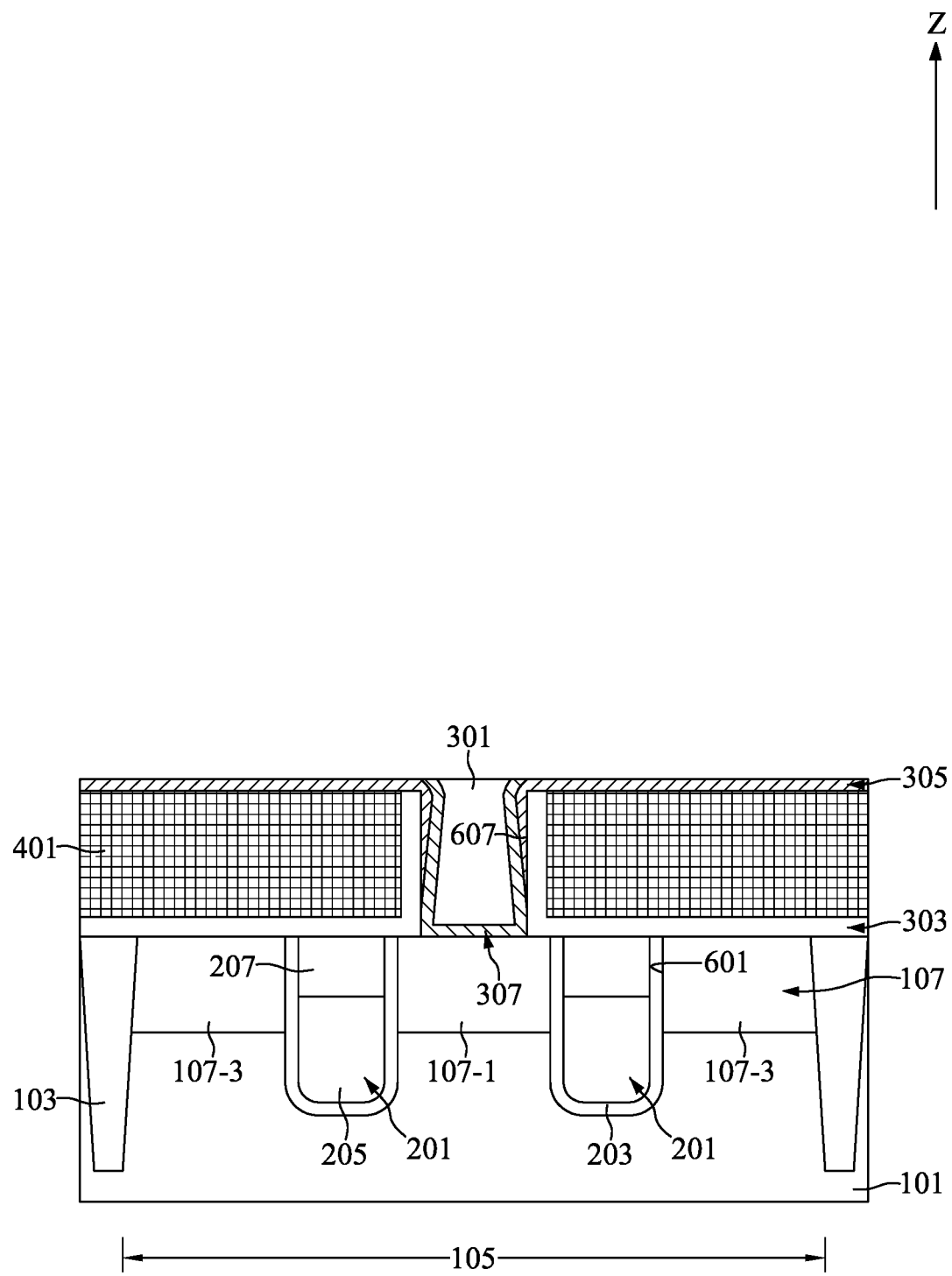

With reference to FIGS. 23 and 24, a layer of first conductive material 609 may be deposited into the first opening 607 by a deposition process. The layer of first conductive material 609 may include doped polysilicon, a metal, or a metal silicide. After the deposition process, a planarization process, such as chemical mechanical polishing, may be performed until the top surfaces of the covering liners 305 are exposed to remove excess material, provide a substantially flat surface for subsequent processing steps, and concurrently form the first conductive feature 301 in the first opening 607. It should be noted that, the first conductive feature 301 may completely fill the first opening 607.

With reference to FIG. 14 and FIGS. 25 to 29, at step S29, a second conductive feature 309 may be formed on the first conductive feature 301, and third conductive features 313 may be formed on the substrate 101.

Figure 25:
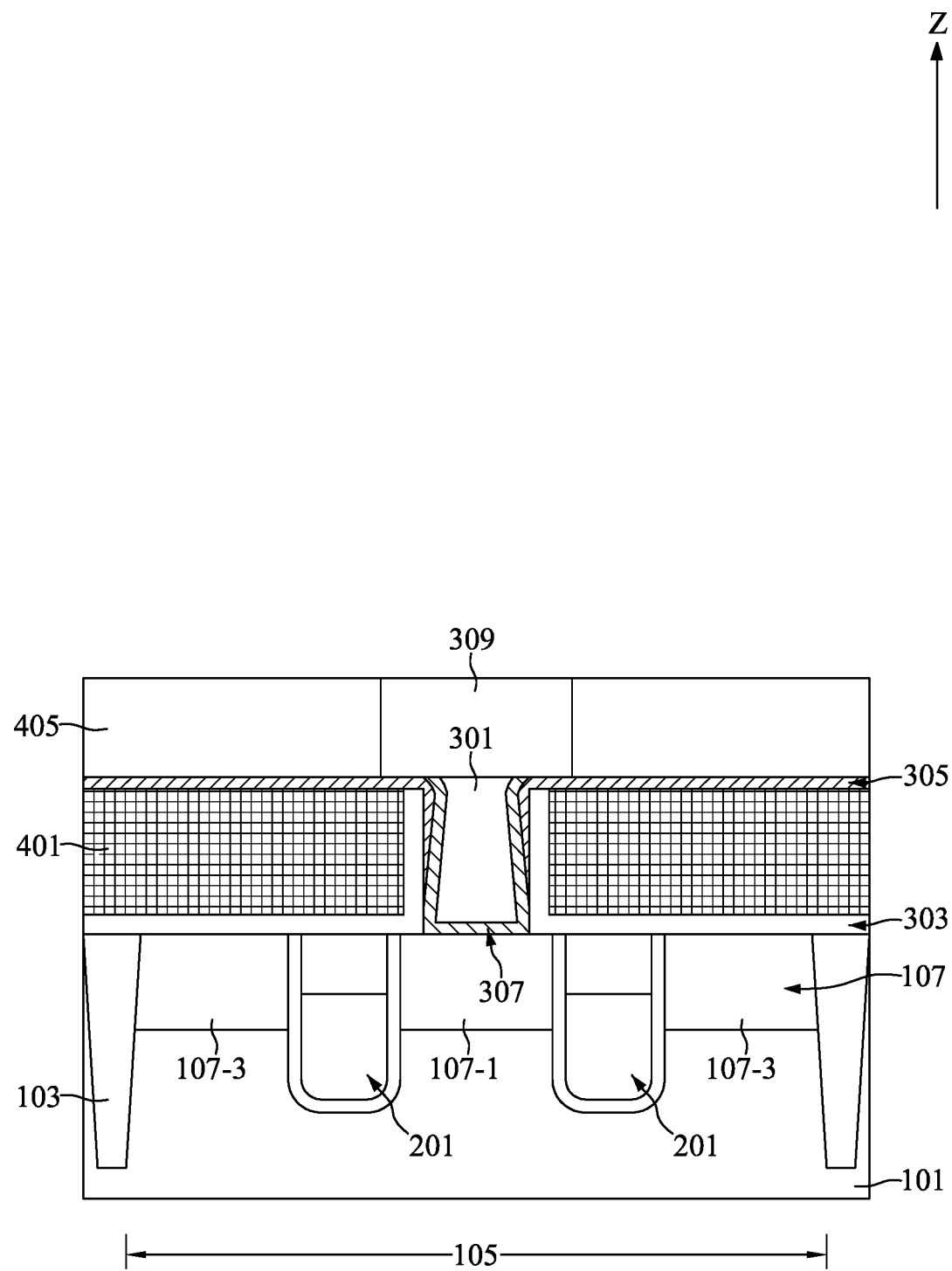

With reference to FIG. 25, an insulating layer 405 may be formed on the covering liners 305 and the first conductive feature 301. The second conductive feature 309 may be formed on the first conductive feature 301 by a damascene process.

Figure 26:
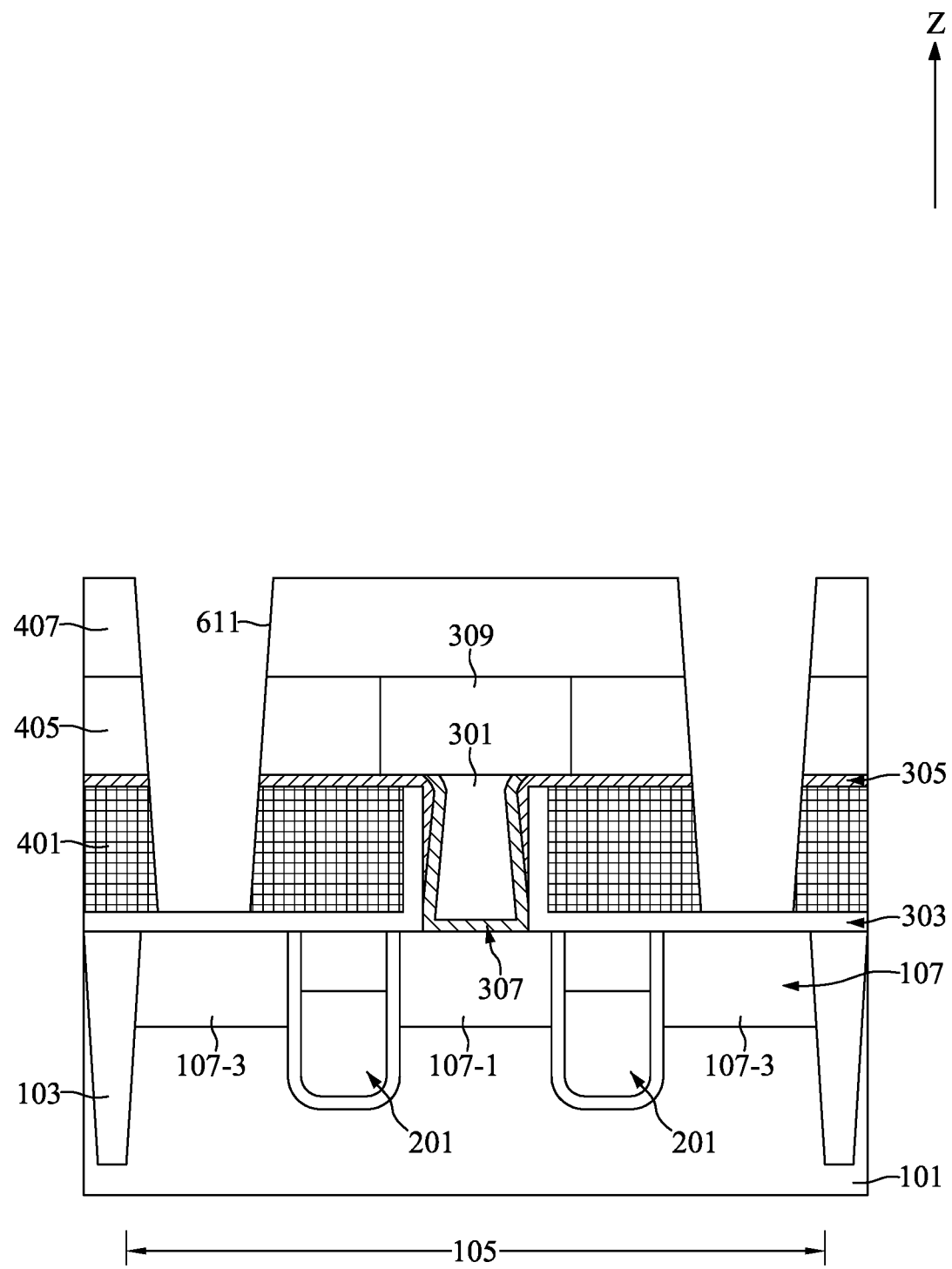

With reference to FIG. 26, an insulating layer 407 may be formed on the insulating layer 405. A photolithography process and a subsequent etch process may be performed to form second openings 611 so as to penetrate the supporting liners 303, the energy-removable layer 401, the covering liners 305, and the insulating layers 405, 407. The two second impurity regions 107-3 may be exposed through the second openings 611.

Figure 27:
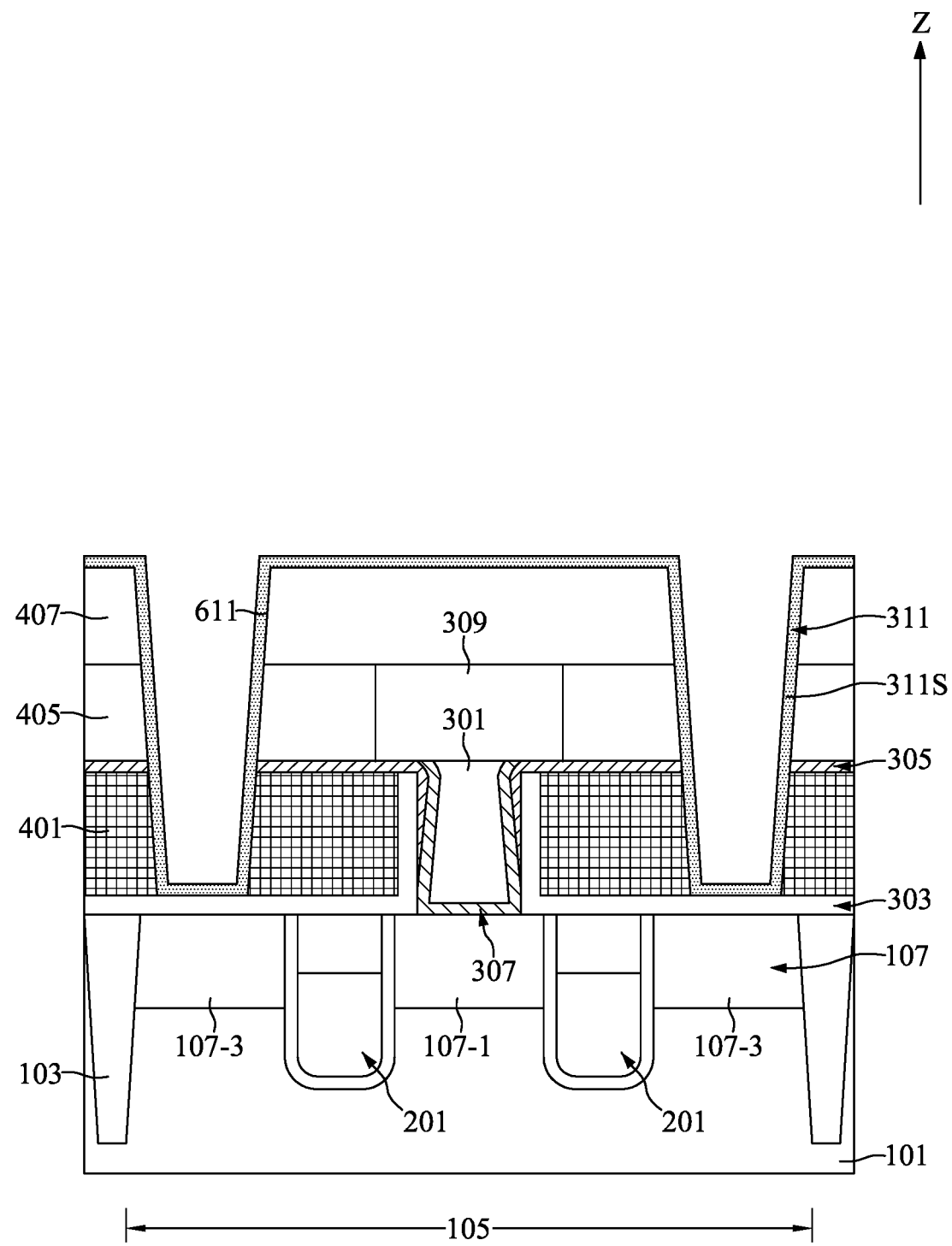

With reference to FIG. 27, a second barrier layer 311 may be conformally formed in the second openings 611. A stabilization process similar with that illustrated in FIG. 22 may be optionally performed on the second barrier layer 311.

Figure 28:
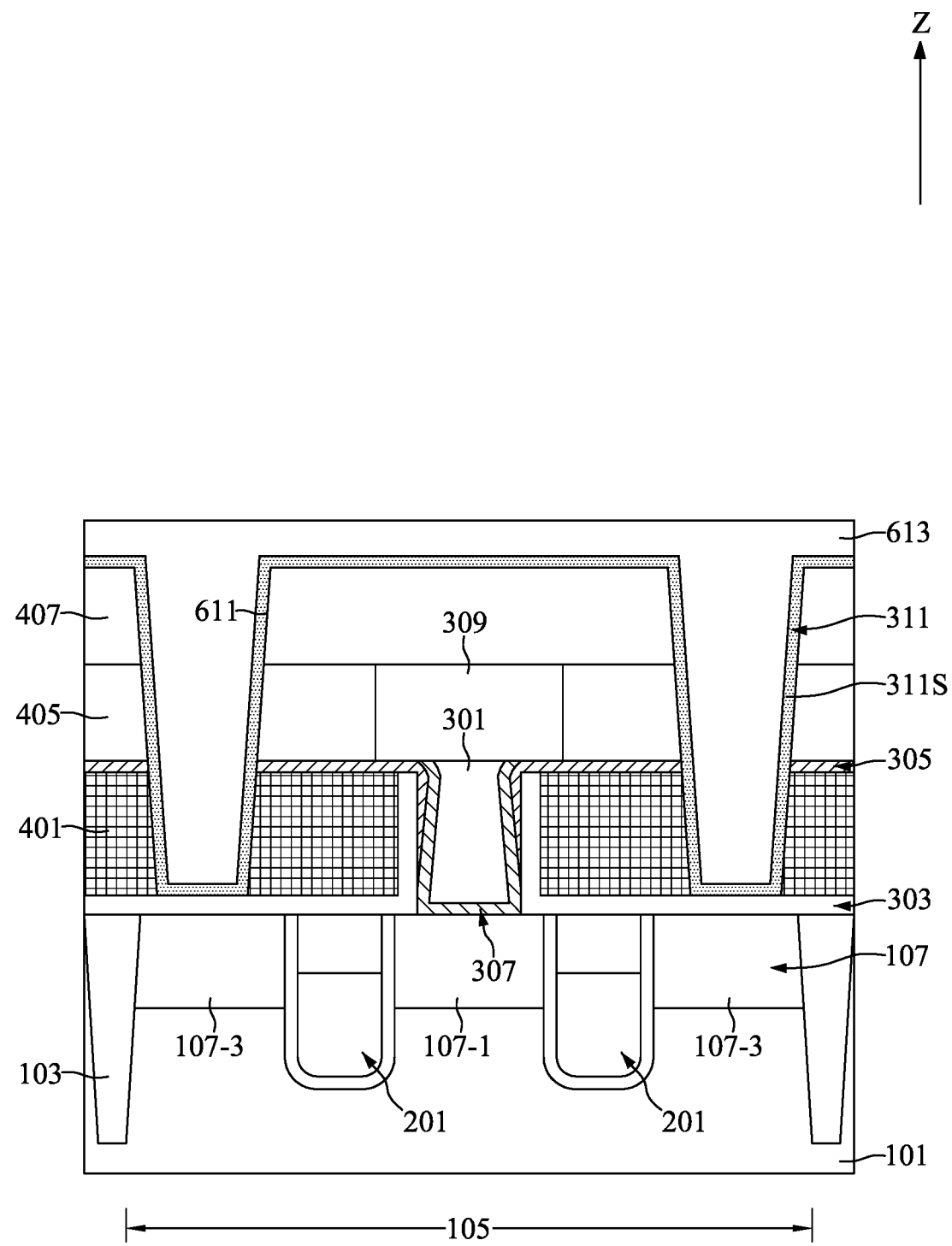

With reference to FIG. 28, a layer of second conductive material 613 may be deposited over the intermediate semiconductor device illustrated in FIG. 27 and completely fill the second openings 611. The layer of contact material 717 may be deposited by atomic layer deposition, chemical vapor deposition, or other conformal deposition method.

Figure 29:
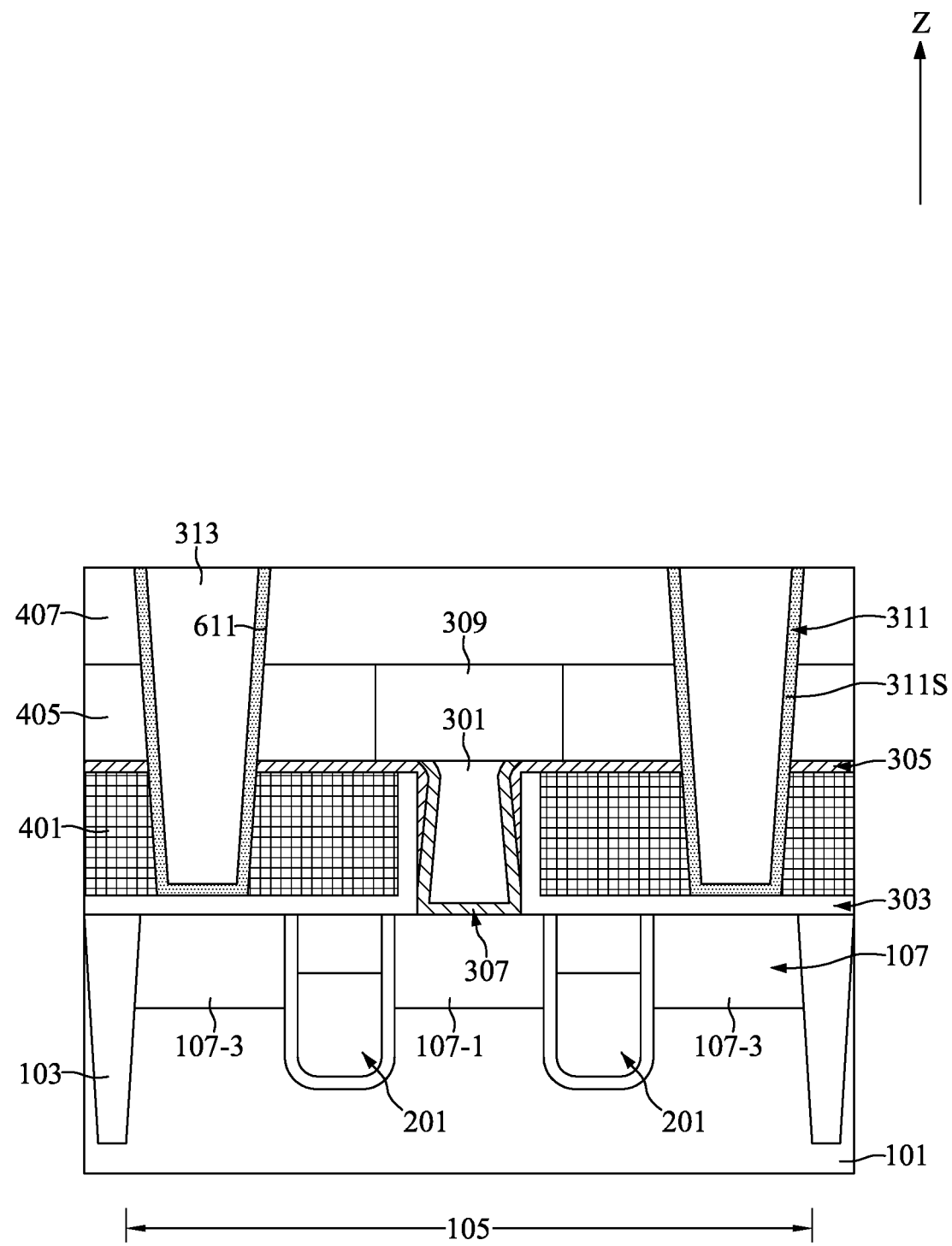

With reference to FIG. 29, a planarization process, such as chemical mechanical polishing, may be performed until the top surface of the insulating layer 407 is exposed to remove excess material, provide a substantially flat surface for subsequent processing steps, and concurrently form the third conductive features 313 in the second openings 611.

Figure 30:
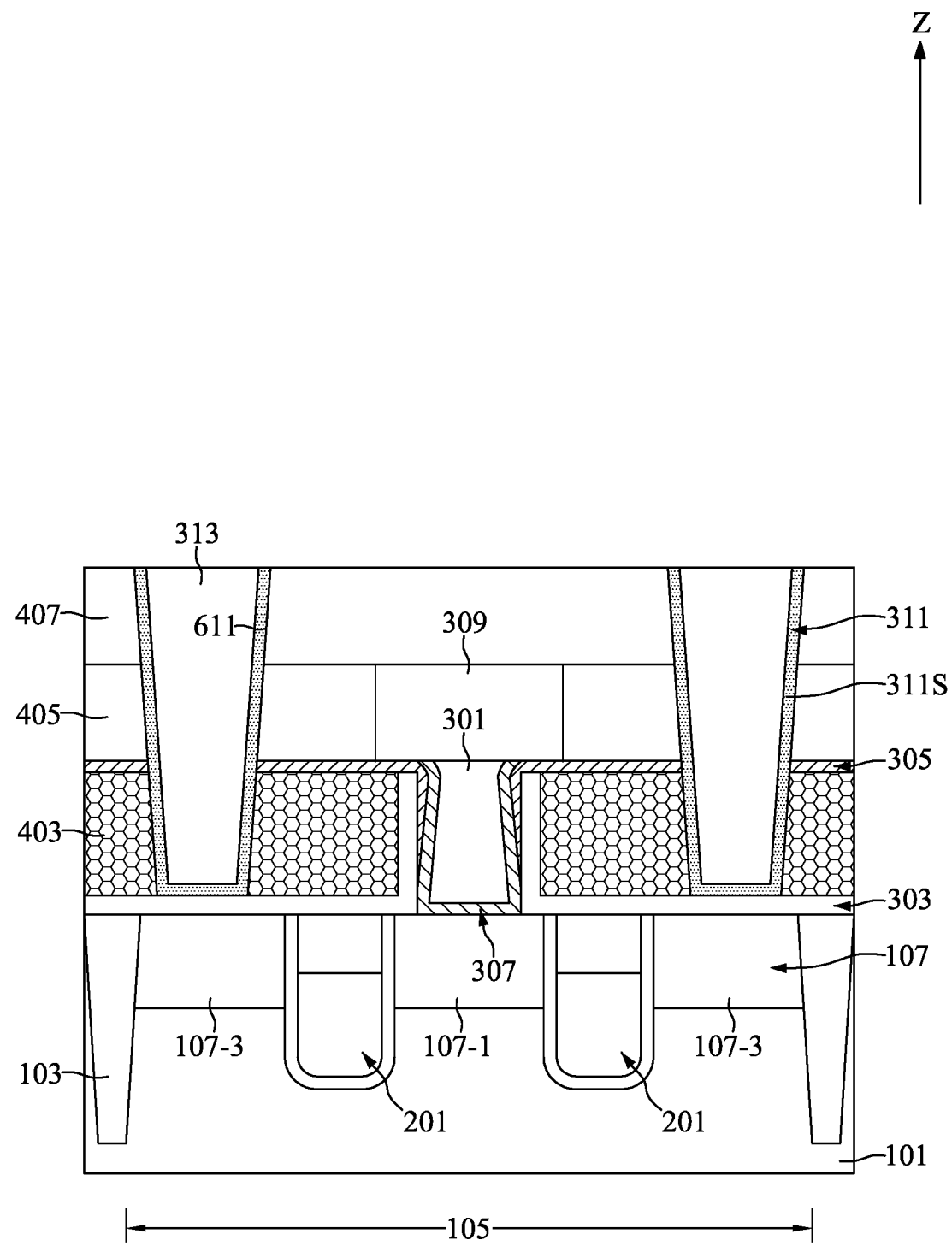

With reference to FIGS. 14 and 30, at step S31, an energy treatment may be performed to turn the energy-removable layer 401 into a porous insulating layer 403.

With reference to FIG. 30, the energy treatment may be performed to the intermediate semiconductor device in FIG. 29 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable layer 401 to generate empty spaces (pores), with the base material remaining in place. After the energy treatment, the energy-removable layer 401 may be turned into the porous insulating layer 403. The base material may be turned into a skeleton of the porous insulating layer 403 and the empty spaces may be distributed among the skeleton of the porous insulating layer 403.

Figure 31:
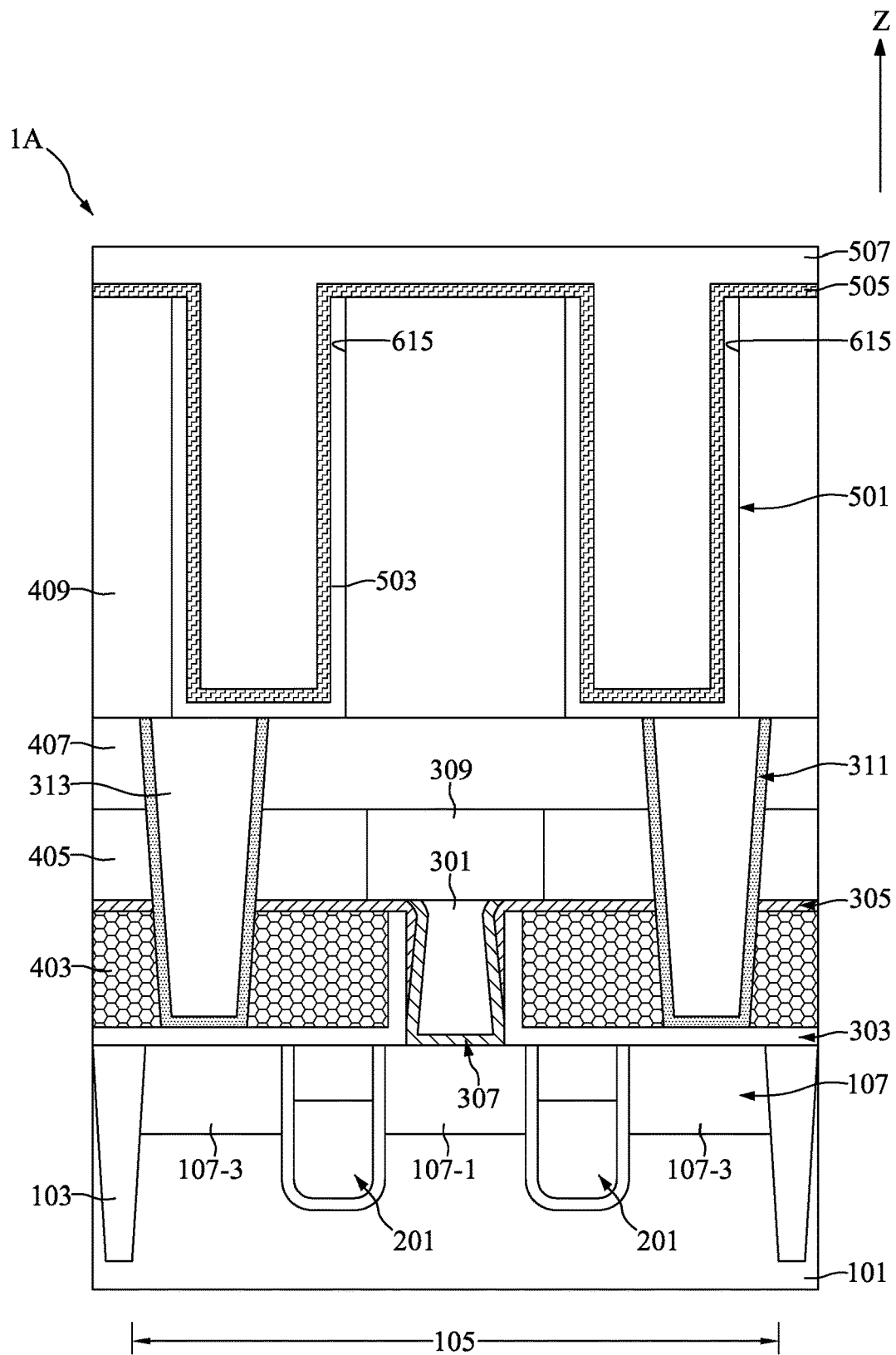

With reference to FIGS. 14 and 31, at step S33, capacitor structures 501 may be formed on the third conductive features 313.

With reference to FIG. 31, an insulating layer 409 may be formed on the insulating layer 407 by a deposition process. A photolithography process may be performed to define positions of the capacitor structures 501. After the photolithography process, an etch process, such as an anisotropic dry etch process, may be performed to form capacitor openings 615 in the insulating layer 409. The third conductive features 313 may be exposed through the capacitor openings 615. Capacitor bottom electrodes 503 may be respectively correspondingly formed in the capacitor openings 615. A capacitor dielectric layer 505 may be formed on the capacitor bottom electrodes 503 in the capacitor openings 615 and formed on the top surface of the insulating layer 409. A capacitor top electrode 507 may be formed on the capacitor dielectric layer 505 and may fill the capacitor openings 615. The capacitor bottom electrodes 503, the capacitor dielectric layer 505, and the capacitor top electrode 507 together form the capacitor structures 501.

FIGS. 32 to 35 illustrate, in schematic cross-sectional diagrams, part of a flow of fabricating a semiconductor device 1D in accordance with another embodiment of the present disclosure.

Figure 32:
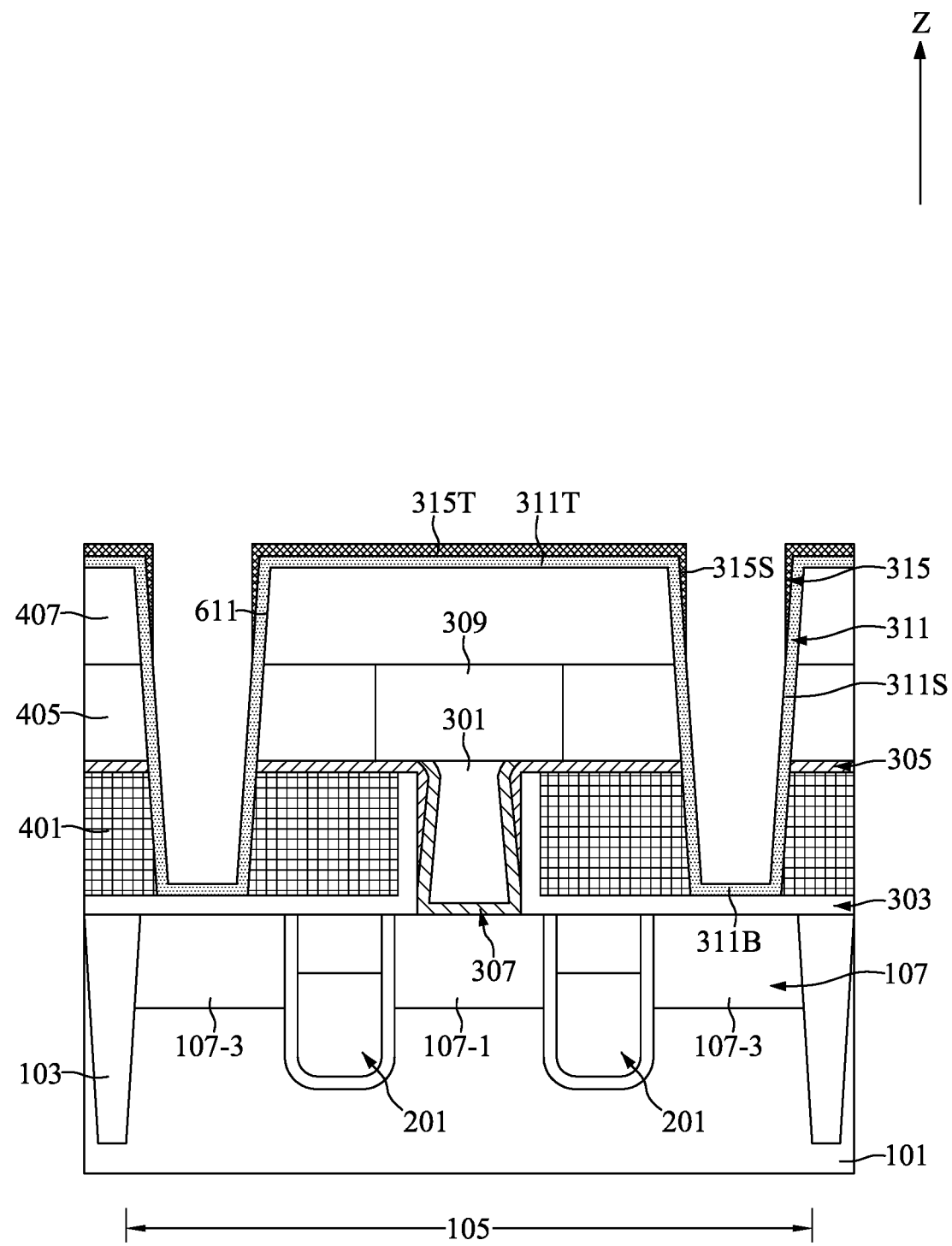
FIGS. 32 to 35 illustrate, in schematic cross-sectional diagrams, part of a flow of fabricating a semiconductor device in accordance with another embodiment of the present disclosure.

With reference to FIG. 32, an intermediate semiconductor device as illustrated in FIG. 27 may be fabricated. The second barrier layer 311 may include bottom segments 311B, side segments 311S, and top segments 311T. The bottom segments 311B and the side segments 311S of the second barrier layer 311 may be respectively correspondingly formed on the sidewalls and the bottom surfaces of the second openings 611. The top segments 311T of the second barrier layer 311 may be formed on the top surfaces of the insulating layer 407.

With reference to FIG. 32, adjustment layers 315 may be conformally formed on the top segments 311T of the second barrier layer 311 and the upper portions of the side segments 311S of the second barrier layer 311.

In some embodiments, the adjustment layers 315 may be formed of, for example, aluminum oxide, hafnium oxide, zirconium oxide, titanium oxide, titanium nitride, tungsten nitride, silicon nitride, or silicon oxide. The adjustment layers 315 may be formed by a procedure similar with the formation of the covering liner 305 illustrated in FIG. 21.

In some embodiments, adjustment layers 315 may be formed of metal nitride or metal carbide. For example, the adjustment layers 315 may be formed of aluminum carbide, aluminum nitride, tungsten carbide, or tungsten nitride. In some embodiments, the adjustment layers 315 may be formed by conformally deposited a metal in the second openings 611. Due to the geometry of the second openings 611 may prevent the metal from reaching the bottom surfaces of the second openings 611. Thus, the metal may deposit faster on the side segments 311S than on the bottom segment 311B of the second barrier layer 311. Subsequently, a plasma treatment using a nitrogen-containing or carbon-containing gas may be applied to transform the metal into a metal nitride or a metal carbide. In some embodiments, the adjustment layers 315 may be conformally formed on the side segments 311S and the bottom segments 311B of the second barrier layer 311. An anisotropic etching process may be applied to remove the adjustment layers 315 formed on the bottom segments 311B of the second barrier layer 311.

Figure 33:
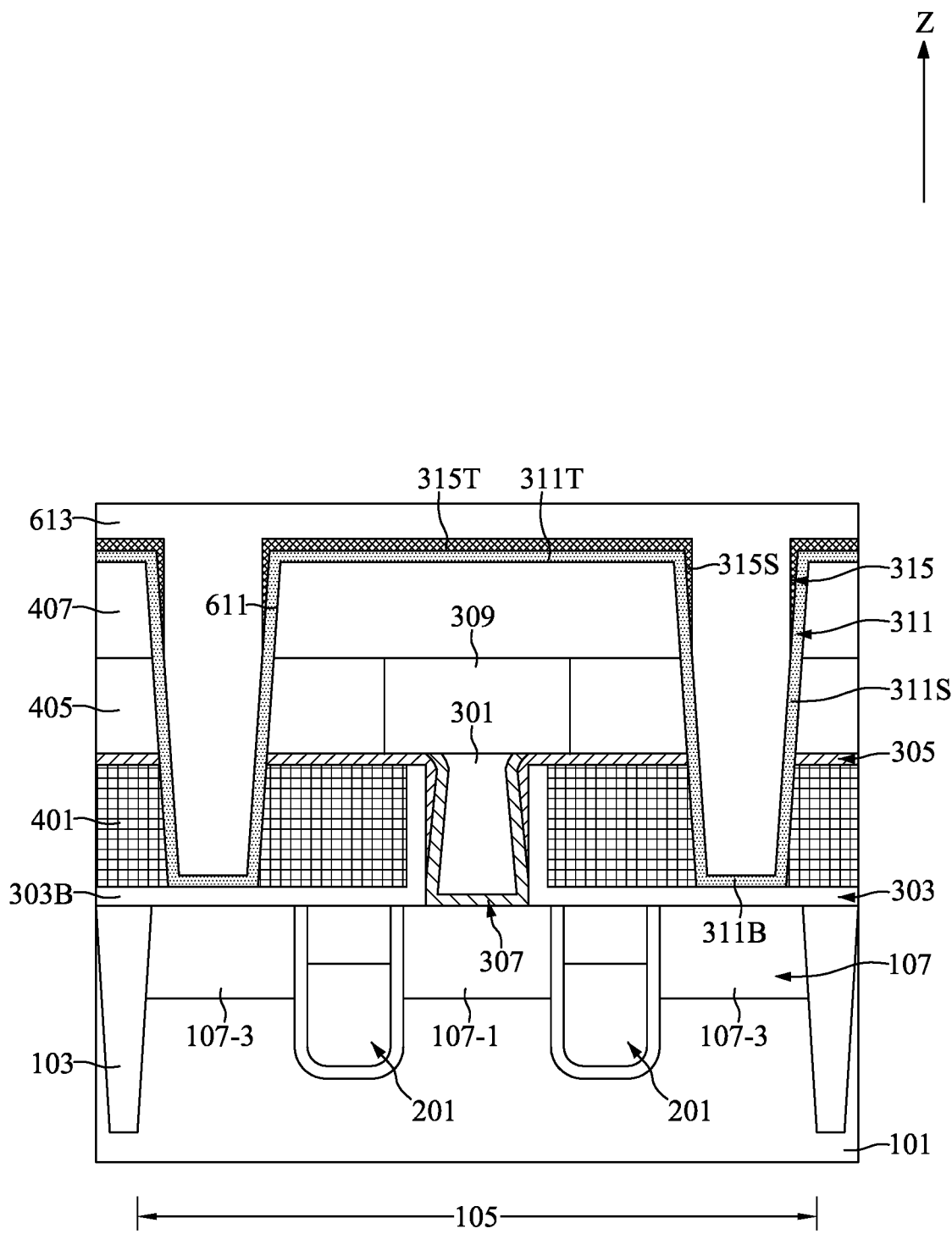

With reference to FIG. 33, a layer of second conductive material 613 may be deposited over the intermediate semiconductor device illustrated in FIG. 32 and completely fill the second openings 611. The layer of second conductive material 613 may be deposited by atomic layer deposition, chemical vapor deposition, or other conformal deposition method. Due to the presence of the adjustment layers 315, the deposition rate of the second conductive material 613 on the sidewalls of the second openings 611 may be reduced. Hence, the deposition rate of the second conductive material 613 on the sidewalls of the second openings 611 and the deposition rate of the second conductive material 613 on the bottom surfaces of the second openings 611 may become close to each other. As a result, the second openings 611 may be filled without any void formation near the bottom surfaces of the second openings 611. The yield of the semiconductor device 1D may be improved.

Figure 34:
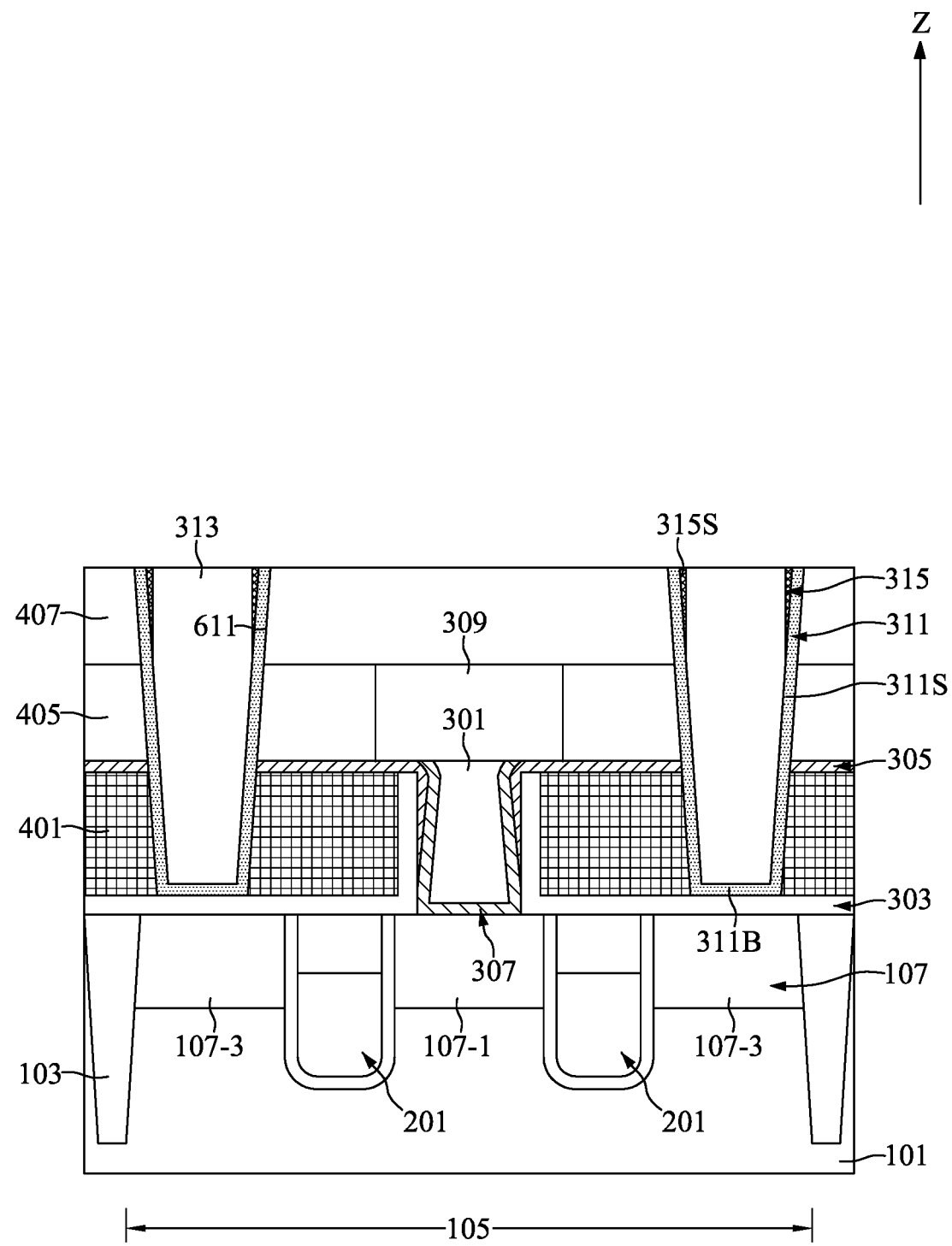

With reference to FIG. 34, a planarization process, such as chemical mechanical polishing, may be performed to remove excess material, the top segments 315T of the adjustment layers 315, and the top segments 311T of the second barrier layer 311. The layer of second conductive material 613 may be turned into the third conductive features 313 after the planarization process.

Figure 35:
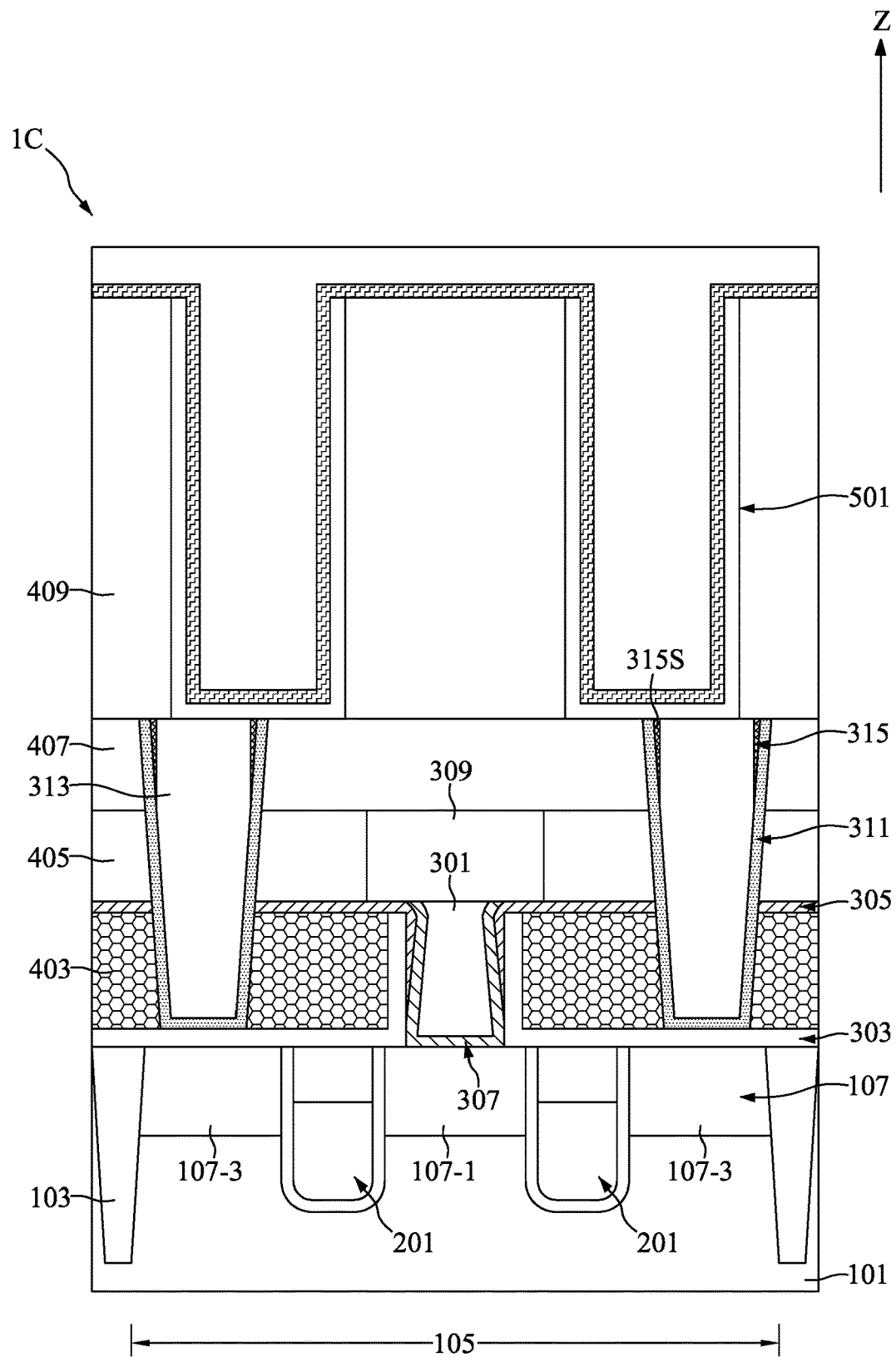

With reference to FIG. 35, the porous insulating layer 403, the capacitor structures 501, and the third insulating layer 409 may be formed a procedure similar to that illustrated in FIGS. 30 and 31. In some embodiments, the energy treatment may be performed after the formation of the capacitor structures 501.

One aspect of the present disclosure provides a semiconductor device including a substrate, a porous insulating layer positioned above the substrate, a first conductive feature positioned in the porous insulating layer, and covering liners including two top segments and two side segments. The two side segments are positioned on sidewalls of the first conductive feature, and the two top segments are positioned on top surfaces of the porous insulating layer.

Another aspect of the present disclosure provides a method for fabricating a semiconductor device including providing a substrate, forming a sacrificial structure above the substrate, forming a supporting liner covering the sacrificial structure, forming an energy-removable layer covering the supporting liner, performing a planarization process until a top surface of the sacrificial structure is exposed, performing an etch process to remove the sacrificial structure and concurrently form a first opening in the energy-removable layer, forming covering liners on sidewalls of the first opening and on a top surface of the energy-removable layer, forming a first conductive feature in the first opening, and applying an energy source to turn the energy-removable layer into a porous insulating layer.

Due to the design of the semiconductor device of the present disclosure, the porous insulating layer 403 may reduce the parasitic capacitance between conductive features (e.g., the first conductive feature 301 and the third conductive features 313) of the semiconductor device 1A. In addition, with the assistant of the covering liners 305, the first conductive feature 301 may be formed without any void. Therefore, the yield of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate;
    forming a sacrificial structure above the substrate;
    forming a supporting liner covering the sacrificial structure by the steps of:
    forming a top segment of the supporting liner to cover a top surface of the sacrificial structure;
    forming side segments of the supporting liner to cover sidewalls of the sacrificial structure; and
    forming a bottom segment of the supporting liner to cover a top surface of the substrate;
    forming an energy-removable layer covering the top segment, the side segments, and the bottom segment of the supporting liner;
    performing a planarization process to remove a top portion of the energy-removable layer and the top segment of the supporting liner until the top surface of the sacrificial structure is exposed;
    performing an etch process to remove the sacrificial structure and concurrently form a first opening in the energy-removable layer;
    forming covering liners on sidewalls of the first opening and on a top surface of the energy-removable layer by the steps of:
    forming a side segment of each of the covering liners to cover on the sidewall of the first opening; and
    forming a top segment of each of the covering liners to cover the top surface of the energy-removable layer, wherein the top segment of the covering liner is integrally extended from the side segment thereof end-to-end;
    forming a first conductive feature in the first opening; and
    applying an energy source to transform the energy-removable layer into a porous insulating layer.

2. The method for fabricating the semiconductor device of claim 1, wherein the supporting liner is formed of silicon nitride.

3. The method for fabricating the semiconductor device of claim 2, wherein the energy-removable layer comprises a base material and a decomposable porogen material.

4. The method for fabricating the semiconductor device of claim 3, wherein the base material comprises methylsilsesquioxane, low-dielectric materials, or silicon oxide.

5. The method for fabricating the semiconductor device of claim 4, wherein the energy source is heat, light, or a combination thereof.

6. The method for fabricating the semiconductor device of claim 5, wherein the covering liners are formed of metal oxide.

7. The method for fabricating the semiconductor device of claim 6, wherein the step of forming the sacrificial structure above the substrate comprises:
    forming a bottom sacrificial layer above the substrate, wherein the bottom sacrificial structure is upwardly extended from the top surface of the substrate;
    forming a top sacrificial layer on the bottom sacrificial layer;
    performing a photolithography-etch process to remove portions of the bottom sacrificial layer and portions of the top sacrificial layer and concurrently form the sacrificial structure.

8. The method for fabricating the semiconductor device of claim 7, wherein the bottom sacrificial layer is formed of silicon carbon.

9. The method for fabricating the semiconductor device of claim 8, further comprising a step of forming a first barrier layer in the first opening before the step of forming the first conductive feature in the first opening, wherein the first barrier layer is formed by the steps of:
    forming a top segment of the first barrier layer to cover on the top segment of the covering liner;
    forming two side segments of the first barrier layer to cover on the side segments of the covering liners respectively, wherein the side segment of the covering liner is sandwiched between the side segment of the supporting liner and the side segment of the first barrier layer; and
    forming a bottom segment of the first barrier layer to cover on the top surface of the substrate.

10. The method for fabricating the semiconductor device of claim 1, wherein a thickness of the side segment of the covering liner is gradually deceased toward the substrate.

11. The method for fabricating the semiconductor device of claim 1, wherein the first opening is formed within the side segments of the supporting liner and the top surface of the substrate.

12. The method for fabricating the semiconductor device of claim 1, wherein a width of the first opening is gradually reduced toward the substrate after the covering liners are formed.

13. The method for fabricating the semiconductor device of claim 1, wherein forming the first conductive feature in the first opening comprising:
    forming a layer of first conductive material to be deposited in the first opening and to cover the top segment of the covering liner; and
    removing a top portion of the layer of first conductive material above the top segment of the covering liner and concurrently forming the first conductive feature in the first opening.

* * * * *